US011705870B2

(12) United States Patent
Hue et al.

(10) Patent No.: US 11,705,870 B2
(45) Date of Patent: Jul. 18, 2023

(54) INTEGRALLY-FORMED SPLITTER FOR MULTIPLE-PATH POWER AMPLIFIERS AND METHODS OF MANUFACTURE THEREOF

(71) Applicant: NXP USA, Inc., Austin, TX (US)

(72) Inventors: Xavier Hue, Frouzins (FR); Olivier Lembeye, Saint Lys (FR); Pascal Peyrot, Frouzins (FR)

(73) Assignee: NXP USA, Inc., Austin, TX (US)

( * ) Notice: Subject to any disclaimer, the term of this patent is extended or adjusted under 35 U.S.C. 154(b) by 273 days.

(21) Appl. No.: 17/024,612

(22) Filed: Sep. 17, 2020

(65) Prior Publication Data

US 2022/0021343 A1   Jan. 20, 2022

(30) Foreign Application Priority Data

Jul. 17, 2020   (EP) .................................... 20305826

(51) Int. Cl.
   *H03F 1/02*   (2006.01)
   *H03F 3/21*   (2006.01)
   *H03F 1/42*   (2006.01)

(52) U.S. Cl.
   CPC ............. *H03F 1/0288* (2013.01); *H03F 1/42* (2013.01); *H03F 3/21* (2013.01); *H03F 2200/36* (2013.01); *H03F 2200/451* (2013.01)

(58) Field of Classification Search
   CPC . H03F 1/0288; H03F 1/42; H03F 3/21; H03F 2200/36; H03F 2200/451
   USPC ........................................................ 330/295
   See application file for complete search history.

(56) References Cited

U.S. PATENT DOCUMENTS

| 5,045,822 | A  |   | 9/1991  | Mohwinkel |
|-----------|----|---|---------|-----------|
| 5,072,199 | A  | * | 12/1991 | Furlow ..................... H03H 7/48 330/148 |
| 5,942,929 | A  | * | 8/1999  | Aparin ................ H03F 3/45183 327/233 |
| 6,577,198 | B1 | * | 6/2003  | Bayruns .................. H03F 3/211 330/84 |
| 8,258,866 | B2 |   | 9/2012  | Saiz et al. |
| 10,103,233| B1 |   | 10/2018 | Khalil et al. |

(Continued)

FOREIGN PATENT DOCUMENTS

| EP | 3664287 A1 | 6/2020 |
| WO | WO-2006/041234 A1 | 4/2006 |

OTHER PUBLICATIONS

"Understanding Power Splitters" Mini-Circuits application note AN 10-006 (Year: 2015).*

(Continued)

*Primary Examiner* — Hafizur Rahman

(57) ABSTRACT

Aspects of the subject disclosure may include a power splitter. The power splitter can include a first splitter branch having a first amplifier with passive components, a second splitter branch having a second amplifier with passive components. The first splitter branch is substantially electrically isolated from the second splitter branch by configuring the first and second splitter branches to have similar phase delays. Outputs of the power splitter can be electrically coupled to the multi-stage amplifier. The power splitter can be manufactured on a single semiconductor die or integrally formed on the same semiconductor die with other circuits such as the multi-stage amplifier. Other embodiments are disclosed.

25 Claims, 9 Drawing Sheets

(56) References Cited

U.S. PATENT DOCUMENTS

| | | | |
|---|---|---|---|
| 2004/0085134 A1* | 5/2004 | Griffith | H03F 3/602 |
| | | | 330/295 |
| 2004/0174213 A1* | 9/2004 | Thompson | H03F 1/0288 |
| | | | 330/124 R |
| 2011/0121912 A1 | 5/2011 | Kim et al. | |
| 2015/0145601 A1* | 5/2015 | Moronval | H03F 1/07 |
| | | | 330/295 |
| 2018/0175801 A1* | 6/2018 | Blednov | H03F 3/213 |
| 2020/0186097 A1 | 6/2020 | Hue et al. | |
| 2020/0304074 A1* | 9/2020 | Jang | H03F 3/19 |

OTHER PUBLICATIONS

Han et al., "A 24.88 nV/H√ Wheatstone Bridge Readout Integrated Circuit with Chopper-Stabilized Multipath Operational Amplifier" published in Appl. Sci. 2020, 10, 399; doi:10.3390/app10010399 (Year: 2020).*

Barta, Gary S. et al.; "A 2 to 8 GHz Leveling Loop Using A GaAs MMIC Active Splitter and Attenuator"; IEEE Microwave and Millimeter-Wave Monolithic Circuits, vol. 86, No. 1; pp. 75-79 (1986).

* cited by examiner

580

585

590

595

INTEGRALLY-FORMED SPLITTER FOR MULTIPLE-PATH POWER AMPLIFIERS AND METHODS OF MANUFACTURE THEREOF

CROSS-REFERENCE TO RELATED APPLICATION

This application claims priority under 35 U.S.C. 119(b) to European patent application No. 20305826.8, filed on Jul. 17, 2020.

TECHNICAL FIELD

Embodiments of the subject matter described herein relate generally to splitters with multiple-path power amplifiers and methods of manufacture thereof that can be utilized with single or multi-stage amplifiers such as Doherty power amplifiers or other suitable amplifier architectures.

BACKGROUND

A typical Doherty power amplifier (PA) includes a signal splitter to receive and divide an input radio frequency (RF) signal, a main amplifier to amplify a first signal from the splitter, a peaking amplifier to amplify a second signal from the splitter, a signal combiner to combine the amplified signals from the main and peaking amplifiers, and various impedance transformation and phase delay elements to ensure that the amplified signals are combined in phase, and that desirable impedances are present at various points within the Doherty PA The signal splitter and signal combiner are commonly implemented on a printed circuit board (PCB) substrate, and the main and peaking amplifiers are implemented using one or more discretely-packaged devices that are physically coupled to the PCB substrate.

In modern wireless 4G and 5G communication systems, the design of RF power amplifiers becomes more complicated. Some of these systems require the PA to operate at very low power output back-off (e.g., 8 to 12 decibels (dB)) for good linearity, while limiting signal compression associated with high peak-to-average power ratio signals and achieving high power added efficiency. Doherty PA and inverted Doherty PA configurations remain popular in wireless base stations. However, high levels of integration are desired to meet the stringent requirements of modern wireless standards, including providing wide instantaneous bandwidths and high efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include a monolithic (i.e., integrally formed in and/or on a single semiconductor die) power splitter that can be electrically coupled to inputs of a multiple-path power amplifier (e.g., Doherty amplifier), each path of the multiple-path power amplifier including a single-stage or multi-stage amplifier. The power splitter can be on a distinct die or combined with the multi-path amplifier on the same die. The power splitter can include a plurality of power splitter branches, each branch configurable to couple to an amplification path of the multi-path amplifier. Each power splitter branch can include an amplifier and adjustment element. The adjustment element can comprise a transmission line, a lumped-element delay circuit, or other suitable delay circuit. The amplifiers used in the power splitter branches can have symmetric or asymmetric gain, and can be configured for a specific frequency band or a range of frequency bands. In order to increase electrical isolation between power splitter branches, each branch can be configured to have similar or substantially equal phase delays (e.g., 90 degrees per branch or other suitable delay). An isolation impedance can also be added between power splitter branches to further increase electrical isolation between such branches.

Although the subject disclosure emphasizes utilization of the power splitter with a Doherty power amplifier, it will be appreciated that the power splitter described below can also be utilized with other suitable single-path or multiple-path amplifiers on the same die or separate dies. Accordingly, it is contemplated that the power splitter descriptions that follow are non-limiting illustrations.

The below-described and illustrated embodiments of Doherty amplifier ICs correspond to two-way Doherty amplifiers that include a main amplifier and one peaking amplifier. Although not explicitly illustrated, other embodiments may include "N-way" Doherty power amplifiers, where N>2, in which the number of peaking amplifiers equals N−1.

Figure 1:
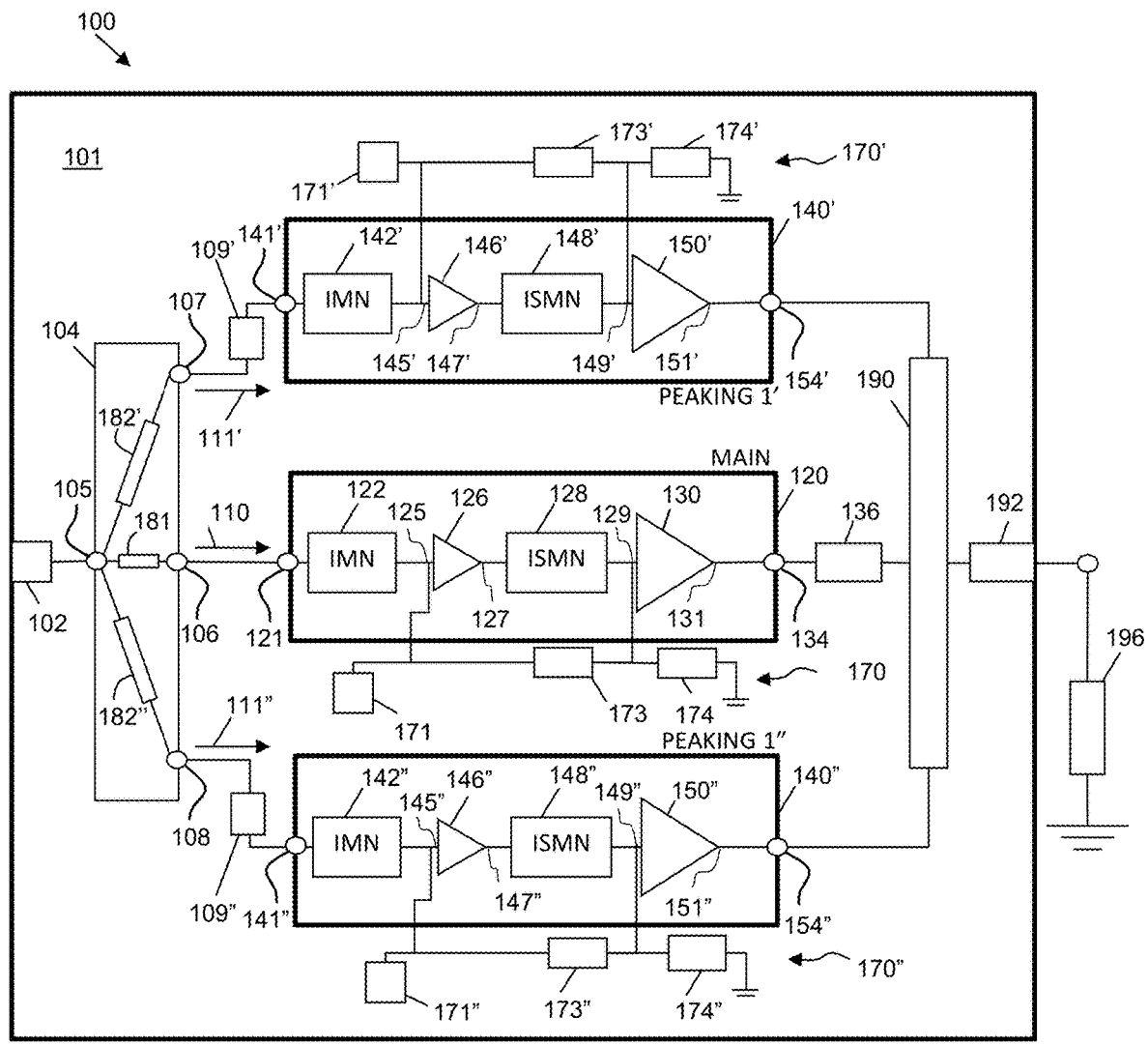
FIG. 1 is a simplified schematic of an integrated Doherty power amplifier, in accordance with an example embodiment.

FIG. 1 is a simplified schematic of an integrated Doherty power amplifier 100, in accordance with an example embodiment. Doherty amplifier 100 includes an input node 102, an output node 192, a power splitter 104 (or splitter), a main amplification path 120, a peaking amplification path 111, and a combining node structure 190. A load 196 may be coupled to the combining node structure 190 (e.g., through an impedance transformer, not shown) to receive an amplified RF signal from amplifier 100.

Doherty power amplifier 100 is considered to be a "two-way" Doherty power amplifier, which includes one main amplifier 120 and one peaking amplifier 140. The main amplifier 120 provides amplification along a first amplification path 110, and the peaking amplifier 140 provides amplification along a second amplification path 111. In the embodiment depicted in FIG. 1, the peaking amplifier 140 is "divided", in that the amplification performed by the peaking amplifier 140 actually is performed by two, substantially identical, peaking amplifier portions 140', 140" (collectively referred to as peaking amplifier 140) along two parallel and substantially identical amplification paths 111', 111" (collectively referred to as amplification path 111). As will be explained in more detail in conjunction with FIG. 2, the peaking amplification paths 111', 111" are physically located on opposite sides of the main amplification path 110, according to an embodiment. In other embodiments, the peaking amplifier 140 may not be "divided", and instead a single amplification path may be used for the peaking amplification path.

Although the main and peaking amplifiers 120, 140 may be of equal size (e.g., in a symmetric Doherty configuration with a 1:1 main-to-peaking size ratio), the main and peaking amplifiers 120, 140 may have unequal sizes, as well (e.g., in various asymmetric Doherty configurations). In an asymmetric two-way Doherty amplifier configuration, the peaking power amplifier 140 typically is larger than the main power amplifier 120 by some multiplier. For example, the peaking power amplifier 140 may be twice the size of the main power amplifier 120 so that the peaking power amplifier 140 has twice the current carrying capability of the main power amplifier 120. Asymmetric main-to-peaking amplifier size ratios other than a 1:2 ratio may be implemented, as well.

Power splitter 104 is configured to divide the power of an input RF signal received at input node 102 into main and peaking portions of the input signal. Because the peaking amplifier 140 is implemented using two peaking amplifier portions 140', 140", as explained above, the peaking portion of the input signal actually consists of two peaking input signals. Accordingly, power splitter 104 is configured to divide the power of the input RF signal received at input node 102 into one main portion of the input signal and two peaking portions of the input signal. The main input signal is provided to the main amplification path 120 at power splitter output 106, and the peaking input signals are provided to the peaking amplification paths 111', 111" at power splitter outputs 107 and 108. During operation in a full-power mode when both the main and peaking amplifiers 120, 140 (including 140' and 140") are supplying current to the load 196, the power splitter 104 divides the input signal power between the amplification paths 110, 111', 111".

For example, the power splitter 104 may divide the power equally, such that roughly one third of the input signal power is provided to each path 110, 111', 111". This may be the case, for example, when Doherty amplifier 100 has an asymmetric Doherty amplifier configuration in which the peaking amplifier 140 is approximately twice the size of the main amplifier 120 (i.e., the Doherty amplifier 100 has an asymmetric configuration with a 1:2 main-to-peaking size ratio). With a 1:2 main-to-peaking size ratio, the combined size of the peaking amplifier portions 140', 140" is about twice the size of the main amplifier 120, which may be achieved when each of amplifiers 120, 140', 140" is about equal in size. Alternatively, the power splitter 104 may divide the power unequally, particularly when the Doherty amplifier 100 has an asymmetric configuration other than a 1:2 main-to-peaking size ratio, or when the Doherty amplifier 100 has a symmetric configuration. In the case of a symmetric Doherty amplifier configuration, the size of the peaking amplifier 140 is about equal to the size of the main amplifier 120 (i.e., the Doherty amplifier 100 has a symmetric configuration with a 1:1 main-to-peaking size ratio). With a 1:1 main-to-peaking size ratio, the combined size of the peaking amplifier portions 140', 140" is about equal to the size of the main amplifier 120, which may be achieved when each of amplifiers 140', 140" is about half the size of amplifier 120. In that case, the power splitter 104 may divide the power so that about half of the input signal power is provided to the main amplification path 120 at power splitter output 106, and about on quarter of the input signal power is provided to each of the peaking amplification paths 111', 111" at power splitter outputs 107 and 108.

Power splitter 104 includes an input node 102, three branches 181, 182', 182", and three output nodes 106-108. In other embodiments, the power splitter 104 may include two branches and two output nodes (e.g., in the embodiment illustrated in FIG. 5B), or more than three branches and output nodes. Each splitter branch 181, 182', 182" of the power splitter 104 includes a pre-driver amplifier and corresponding adjustment element, which will be described below in FIGS. 5A-5I. The pre-driver amplifier and adjustment element of each splitter branch 181, 182', 182" amplifies a divided input RF signal supplied at the input node 102 with equal phase across the splitter branches 181, 182', 182", and the divided signals produced at output nodes 106-108 are separately further amplified along the main and peaking amplification paths 110, 111', 111". The amplified signals generated by the main and peaking amplification paths 110, 111', 111" are then combined in phase at the combining node structure 190. It is important that phase coherency between the main and peaking amplification paths 110, 111', 111" is maintained across a frequency band of interest to ensure that the amplified main and peaking signals arrive in phase at the combining node structure 190, and thus to ensure proper Doherty amplifier operation. In the Doherty amplifier configuration depicted in FIG. 1 (i.e., a non-inverted Doherty configuration, as described below), input phase delay circuits 109', 109" are coupled between power splitter outputs 107 and 108 and peaking amplifier inputs 141', 141". According to an embodiment, each input phase delay circuit 109', 109" applies about 90 degrees of phase delay to the peaking input signals before they are provided to the peaking amplifier portions 140', 140". For example, each input phase delay circuit 109', 109" may include a quarter wave transmission line, a lumped-element delay circuit, or another suitable type of delay element with an electrical length of about 90 degrees.

The pre-driver amplifier in each splitter branch 181, 182', 182" includes a single power transistor (e.g., composed of one or multiple transistor fingers). The main amplifier 120 and the peaking amplifier portions 140', 140" can be configured to include a single power transistor or multiple cascaded power transistors for amplifying an RF signal conducted through the amplifiers 120, 140', 140". As used herein, the term "transistor" means a field effect transistor (FET) or another type of suitable transistor. For example, a "FET" may be a metal-oxide-semiconductor FET (MOS- FET), a laterally-diffused MOSFET (LDMOS FET), an enhancement-mode or depletion-mode high electron mobility transistor (HEMT), or another type of FET. According to various embodiments, each of the power transistors in the main and peaking amplifier portions 120, 140', 140" may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

According to an embodiment of the Doherty amplifier 100, the main amplifier 120 is a two-stage amplifier, which includes a relatively low-power driver amplifier 126 and a relatively high-power final-stage amplifier 130 connected in a cascade arrangement between main amplifier input 121 and main amplifier output 134. In the main amplifier cascade arrangement, an output 127 of the driver amplifier 126 is electrically coupled to an input 129 of the final-stage amplifier 130. Similarly, each of the peaking amplifier portions 140', 140" is a two-stage amplifier, which includes a relatively low-power driver amplifier 146', 146" and a relatively high-power final-stage amplifier 150', 150" connected in a cascade arrangement between a peaking amplifier input 141', 141" and a peaking amplifier output 154', 154". In each peaking amplifier cascade arrangement, an output 147', 147" of the driver amplifier 146', 146" is electrically coupled to an input 149', 149" of the final-stage amplifier 150', 150".

In other embodiments, the main amplifier 120 and the peaking amplifier portions 140', 140" may include a single-stage amplifier (e.g., driver amplifiers 126, 146', 146" may be excluded). In yet other embodiments, the power splitter 104 can be coupled to a Doherty amplifier 100 in which the main and peaking amplifier paths each have more than the two, cascade-coupled amplification stages shown in FIG. 1. Input and inter-stage impedance matching networks 122, 142', 142", 128, 148', 148" (IMN, ISMN) may be implemented, respectively, at the input 125, 145', 145" of each driver amplifier 126, 146', 146" and between each driver amplifier 126, 146', 146" and each final-stage amplifier 130, 150', 150". In each case, the matching networks 122, 142', 142", 128, 148', 148" may incrementally increase the circuit impedance toward the load impedance. In addition to providing signal amplification of an input signal at the input node 102, each splitter branch 181, 182', 182" of the power splitter 104 may also provide a 50 ohm (or other) input impedance suitable for the input node 102 and output impedance matching characteristics that may eliminate in whole or in part a need for matching networks IMN 122, 141', 141" of the main amplifier 120 and the peaking amplifier portions 140', 140", respectively.

During operation of Doherty amplifier 100, the main amplifier 120 is biased to operate in class AB mode, and the peaking amplifier 140 typically is biased to operate in class C mode. In some configurations, the peaking amplifier 140 may be biased to operate in class B or deep class B modes. In an embodiment, the amplifier of each splitter branch 181, 182', 182" may also be biased to operate according to the same class mode or a suitable class mode of operation in conjunction with the class modes utilized by the main amplifier 120 and the peaking amplifier portions 140', 140", respectively. At low power levels, where the power of the input signal at node 102 is lower than the turn-on threshold level of peaking amplifier 140, the amplifier 100 operates in a low-power (or back-off) mode in which the main amplifier 120 is the only amplifier supplying current to the load 196.

When the power of the input signal exceeds a threshold level of the peaking amplifier 140, the amplifier 100 operates in a high-power mode in which the main amplifier 120 and the peaking amplifier 140 both supply current to the load 196.

At this point, the peaking amplifier 140 provides active load modulation at combining node structure 190, allowing the current of the main amplifier 120 to continue to increase linearly. As will be explained in more detail in conjunction with FIG. 2, later, gate biasing of the main and peaking amplifiers 120, 140 is performed using one or more resistor-divider gate bias circuits 170, 170', 170" (e.g., resistor-divider gate bias circuits 270, 270', 270", FIG. 2), in an embodiment, where each resistor-divider gate bias circuit 170, 170', 170" includes at least one resistor 173, 174, 173', 173", 174', 174" electrically coupled between a gate bias voltage input 170, 170', 170" and an input 125, 129, 145', 145", 149', 149" (e.g., a gate terminal) of each amplifier 126, 130, 146', 146", 150', 150". Although not shown in FIG. 1, the amplifier of each splitter branch 181, 182', 182" may utilize the same resistor-divider gate bias circuits 170, 170', 170" or other suitable resistor-divider circuits utilized by the main amplifier 120 and the peaking amplifier portions 140', 140", respectively.

Doherty amplifier 100 has a "non-inverted" load network configuration. In the non-inverted configuration, the input circuit is configured so that the input signals supplied to the peaking amplifier portions 140', 140" are delayed by 90 degrees with respect to the input signal supplied to the main amplifier 120 at the center frequency of operation, fo, of the amplifier 100. To ensure that the main and peaking input RF signals arrive at the main and peaking amplifiers 120, 140, 140" with about 90 degrees of phase difference, as is fundamental to proper Doherty amplifier operation, input phase delay circuits 109', 109" each apply about 90 degrees of phase delay to the peaking input signals before they are provided to the peaking amplifier portions 140', 140", as described above.

To compensate for the resulting 90 degree phase delay difference between the main and peaking amplification paths 110, 111', 111" at the inputs of amplifiers 120, 140', 140" (i.e., to ensure that the amplified signals arrive in phase at the combining node structure 190), an output phase delay circuit 136 is configured to apply about a 90 degree phase delay to the signal between the output of main amplifier 120 and the combining node structure 190.

Alternate embodiments of Doherty amplifiers may have an "inverted" load network configuration. In such a configuration, the amplifier is configured so that an input signal supplied to the main amplifier 120 is delayed by about 90 degrees with respect to the input signals supplied to the peaking amplifier portions 140', 140" at the center frequency of operation, fo, of the amplifier 100, and output phase delay circuits are configured to apply about a 90 degree phase delay to the signals between the outputs of the peaking amplifier portions 140', 140" and the combining node structure 190.

Doherty amplifier 100 is "integrated," as that term is used herein, because at least the main amplifier 120 (e.g., including the driver amplifier 122 and the final-stage amplifier 130), the peaking amplifier 140 (including the driver amplifiers 146', 146" and the final-stage amplifiers 150', 150"), and the combining node structure 190 are integrally- and monolithically-formed in one single IC die 101 (e.g., die 201, FIG. 2), which may be referred to herein as an "integrated Doherty amplifier die." In an alternate embodiment, the combining node structure 190 may be implemented separately from the IC die that includes the main amplifier 120 and the peaking amplifier 140. According to an embodiment, all or portions of the input and inter-stage impedance matching networks 122, 142', 142", 128, 148', 148" also may be integrally- and monolithically-formed in the same IC die (e.g., die 201, FIG. 2).

Alternatively, all or portion of the input impedance matching networks 122, 142', 142" may be implemented in one or more components that are distinct from the IC die that includes the main and peaking amplifiers 120, 140. According to a further embodiment, the input node 102, power splitter 104, and output node 192 also are integrally- and monolithically-formed in the same IC die (e.g., die 201, FIG. 2) as the main and peaking amplifiers 120, 140. In an alternate embodiment, the input node 102 and power splitter 104 may be implemented in one or more components that are distinct from the IC die that includes the main and peaking amplifiers 120, 140. According to another further embodiment, the resistor-divider bias circuits 170, 170', 170" also are integrally- and monolithically-formed in the same IC die (e.g., die 201, FIG. 2) as the main and peaking amplifiers 120, 140 and the combining node structure 190, although biasing may be performed by non-integrated circuits and structures in other embodiments.

Figure 2:
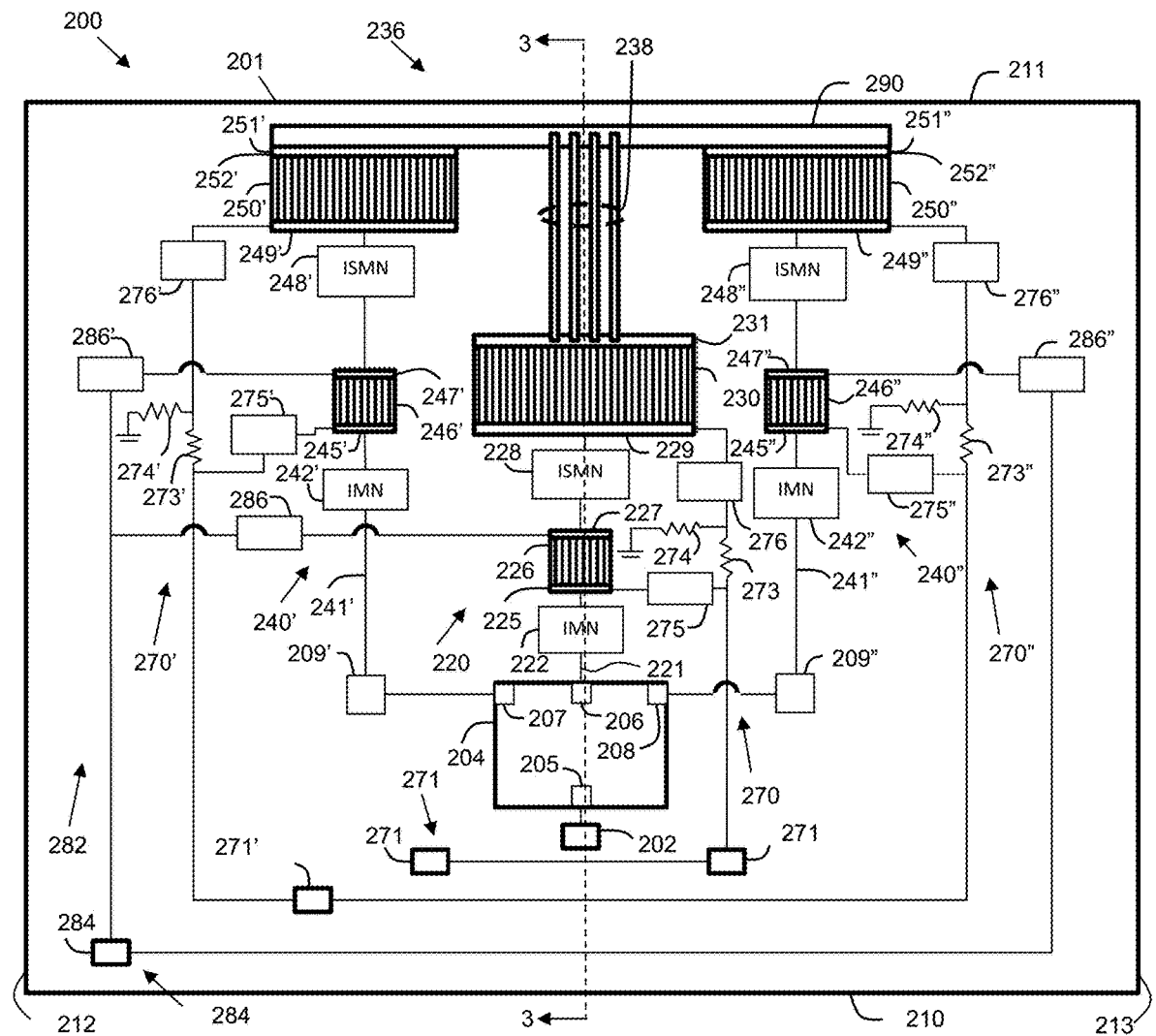
FIG. 2 is a top view of a Doherty power amplifier integrated circuit (IC), in accordance with an example embodiment.

FIG. 2 is a top view of a Doherty power amplifier IC 200 (or "Doherty IC"), in accordance with an example embodiment. For enhanced understanding, FIG. 2 should be viewed simultaneously with FIG. 3, which is a side, cross-sectional view of the Doherty IC 200 of FIG. 2 along line 3-3. As used herein, the terms "integrated circuit die" and "IC die" mean a single, distinct semiconductor die (or semiconductor substrate) within which one or more circuit components (e.g., transistors, passive devices, and so on) are integrally-formed and/or directly physically connected to produce a monolithic structure.

Doherty IC 200 includes substantially an entire Doherty amplifier (e.g., Doherty amplifier 100, FIG. 1) integrally- and monolithically-formed in and on a single semiconductor die 201, where the semiconductor die has a substantially rectangular periphery defined by opposed input and output sides 210, 211 (e.g., bottom and top sides in the orientation of FIG. 2) and opposed left and right sides 212, 213 that extend between the input and output sides. In the specific embodiment illustrated in FIG. 2, Doherty amplifier IC 200 includes the following circuitry integrally- and monolithically-formed in and on semiconductor die 201: an input terminal 202 (e.g., input node 102, FIG. 1), a power splitter 204 (e.g., power splitter 104, FIG. 1), input phase delay circuits 209', 209" (e.g., input phase delay circuits 109', 109", FIG. 1), a two-stage main amplifier 220 (e.g., main amplifier 120, FIG. 1), a divided peaking amplifier consisting of first and second peaking amplifier portions 240', 240" (e.g., peaking amplifier portions 140', 140", FIG. 1), an output phase delay circuit 236 (e.g., output phase delay circuit 136, FIG. 1), a combining node structure 290 (e.g., combining node structure 190, FIG. 1), and resistor-divider bias circuits 270, 270', 270" (e.g., resistor-divider bias circuits 170, 170', 170", FIG. 1).

In various alternate embodiments, one or more of the input terminal 202, power splitter 204, input phase delay circuits 209', 209", and/or resistor-divider gate bias circuits 270, 270', 270" may be implemented using circuitry and/or on substrates that are physically distinct from the semiconductor die 201 in and on which the remaining portions of the Doherty amplifier are formed. Although not shown in FIG. 2, the power splitter 204 can share the same resistor-divider gate bias circuits 270, 270', 270" or other suitable bias circuits utilized by the main amplifier 220 and the peaking amplifier portions 240', 240", respectively.

Figure 3:
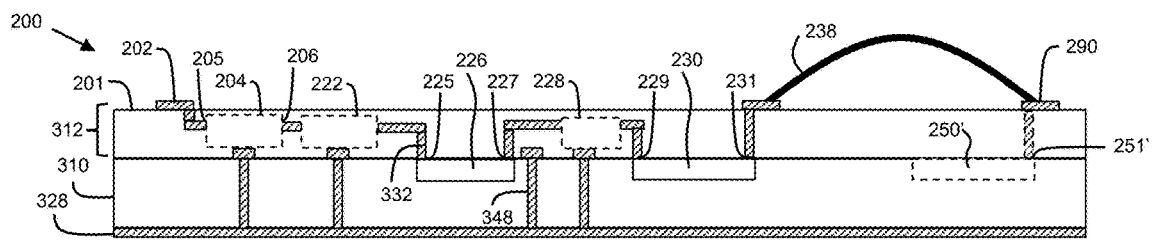
FIG. 3 is a side, cross-sectional view of the Doherty amplifier IC of FIG. 2 along line 3-3, in accordance with an example embodiment.

As seen most clearly in FIG. 3, the semiconductor die 201 includes a base semiconductor substrate 310 and a plurality of build-up layers 312 over a top surface of the base semiconductor substrate 310. In a particular example embodiment, the base semiconductor substrate 310 is a high-resistivity silicon substrate (e.g., a silicon substrate having bulk resistivity in a range of about 1000 ohm/centimeter (cm) to about 100,000 ohm/cm or greater). Alternatively, the base semiconductor substrate 310 may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate 310 may be any of multiple variants of a GaN substrate or other III-V semiconductor substrates.

Figure 6:
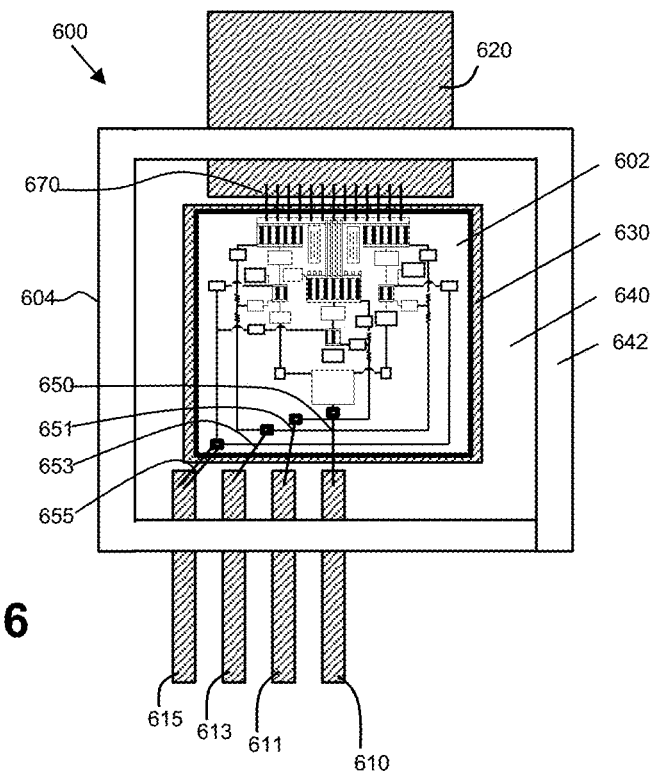
FIG. 6 is a top view of a Doherty amplifier device packaged in a high-power package, in accordance with an example embodiment.

The plurality of build-up layers 312 may include, for example, a plurality of interleaved dielectric layers, patterned conductive layers, and other conductive structures (e.g., conductive polysilicon structures). Portions of different patterned conductive layers and structures are electrically coupled with conductive vias (e.g., via 332). Further, conductive through substrate vias (TSVs) (e.g., TSV 348) may provide conductive paths between the top and bottom surfaces of the base semiconductor substrate 310. The TSVs may or may not be lined with dielectric material to insulate the TSVs from the base semiconductor substrate 310. According to an embodiment, a conductive layer 328 on the bottom surface of the base semiconductor substrate 310 functions as a ground node for the Doherty IC 200. Although not shown in FIG. 3, but as indicated in FIG. 6, when the Doherty IC 200 ultimately is packaged, the conductive layer 328 may be physically and electrically coupled to a ground node of a package substrate (e.g., flange 630, FIG. 6).

In the below description of the Doherty IC 200, reference will be made to various circuits that include capacitors, inductors, and/or resistors. The capacitors may be, for example, integrated metal-insulator-metal (MIM) capacitors formed within the build-up layers 312, and/or small chip capacitors (discrete capacitors) coupled to the top surface of the die 201, in various embodiments. The resistors may be, for example, integrated resistors (e.g., formed from polysilicon within the build-up layers 312), or small discrete resistors coupled to the top surface of the die 201. The inductors may be integrated spiral inductors (e.g., formed from patterned conductive layers and vias within the build-up layers 312), or they may be discrete inductors or inductances formed from wirebonds or other inductive components.

In the embodiment of FIGS. 2 and 3, each of the main amplifier 220 and the peaking amplifier portions 240', 240" include a cascade arrangement of two power transistors, including a relatively low-power driver amplifier transistor 226, 246', 246" (e.g., driver amplifiers 126, 146', 146", FIG. 1) and a relatively high-power final-stage amplifier transistor 230, 250', 250" (e.g., final-stage amplifiers 130, 150', 150", FIG. 1). In other embodiments, the driver amplifier transistors 226, 246', 246" may be excluded, and the main amplifier 220 and peaking amplifier portions 240', 240" may include just the high-power final-stage amplifier transistor 230, 250', 250". The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 226, 246', 246", 230, 250', 250" includes a gate terminal 225, 229, 245', 245", 249', 249" (or control terminal), a drain terminal 227, 231, 247', 247", 251', 251" (or first current-carrying terminal), and a source terminal (or second current-carrying terminal), not numbered. In a specific embodiment, each transistor 226, 246', 246", 230, 250', 250" is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate 310. Due to their elongated shapes, each set of adjacent drain and source regions, along with an associated gate structure, may be referred to as a "transistor finger," and each transistor 226, 246', 246", 230, 250', 250" includes a plurality of parallel transistor fingers within the active area of the transistor (indicated with vertical lines in FIG. 2).

A variably-conductive channel (and, in some embodiments, a drain drift region) is present between adjacent source and drain regions. Conductive (e.g., polysilicon or metal) gate structures formed over the base semiconductor substrate 310 are coupled to and extend from each gate terminal 225, 229, 245', 245", 249', 249" over and along the channel regions. Similarly, additional conductive (e.g., polysilicon) drain structures formed over the base semiconductor substrate 310 are coupled to and extend from each drain terminal 227, 231, 247', 247", 251', 251" over and along the drain regions. The source regions are electrically coupled to conductive (e.g., polysilicon or metal) source contacts, which in turn are coupled to conductive TSVs (e.g., TSV 348, FIG. 3) that extend through the base semiconductor substrate 310 to connect with conductive layer 328 on the bottom surface of the base semiconductor substrate 310. Voltages applied to the gate terminals 225, 229, 245', 245", 249', 249" during operation modulate the conductivity of the variably-conductive channels, thus enabling current flow between source and drain regions (or ultimately between conductive layer 328 and each drain terminal 227, 231, 247', 247", 251', 251").

The circuitry integrated within and coupled to Doherty IC 200 will now be described in more detail. Referring again to FIG. 2, the input terminal 202 (e.g., input node 102, FIG. 1), which is configured to receive an input RF signal for amplification, is electrically connected to a splitter input 205 (e.g., input 105, FIG. 1) of power splitter 204 through a conductive path implemented in the build-up layers 312 of the Doherty IC 200. Input terminal 202 may include, for example, a conductive bondpad, which is exposed at the top surface of the die 201, and which is configured for attachment of one or more wirebonds (e.g., wirebond 650, FIG. 6). Alternatively, die 201 may be a flip-chip die or the input terminal may be exposed at the bottom surface of the die 201, in which case the input terminal 202 may consist of a conductive land or other type of connection. These alternate configurations also may apply to the other terminals (e.g., terminals 271, 271', and 284) of the Doherty IC 200.

The power splitter 204 (e.g., power splitter 104, FIG. 1) is configured to divide the power of an input RF signal received at input terminal 205 into main and peaking portions of the input signal and to pre-amplify the main and peaking portions of the input signal. As described in conjunction with FIG. 1, because the peaking amplifier is implemented using two peaking amplifier portions 240', 240", power splitter 204 has three branches, and is configured to divide the power of the input RF signal received at input terminal 202 into one main portion of the input signal and two peaking portions of the input signal. The main portion of the input signal and the peaking portions of the input signal each are pre-amplified along the three power splitter branches. Essentially, the power splitter includes a same number of branches as amplification paths. Thus, in an alternate embodiment in which the peaking amplifier is implemented using only a single amplifier path, the power splitter may include only two branches (e.g., as in the embodiment of FIG. 5B).

In the illustrated embodiment, the main input signal is produced at power splitter output 206 (e.g., output 106, FIG. 1), and the peaking input signals are produced at power splitter outputs 207 and 208 (e.g., outputs 107 and 108, FIG. 1). As also discussed previously, the power splitter 204 may divide and pre-amplify the power equally or unequally, depending on the relative sizes of the main amplifier 220 and the peaking amplifier portions 240', 240". In the embodiment of FIG. 2, the sizes of the main amplifier 220 and the peaking amplifier portions 240', 240" are approximately equal (i.e., the three amplifiers 220, 240', 240" have a 1:1:1 size relationship, and the Doherty amplifier is an asymmetric amplifier with a 1:2 main-to-peaking ratio), and thus the power splitter 204 divides the input RF signal so that roughly one third of the pre-amplified input signal power is produced at each power splitter output 206-208. In other embodiments, the sizes of the main amplifier 220 and the peaking amplifier portions 240', 240" may be unequal, in which case the power splitter 204 may produce amplified RF signals with unequal power.

Input terminal 205 has a 50 ohm input impedance, in an embodiment, although the input impedance may be less or greater than 50 ohms, as well. According to an embodiment, the power splitter 204 has a Wilkinson-based design with active elements (e.g., power transistors), and the power splitter 204 essentially divides and pre-amplifies the power of the input signal received at input 205 into three pre-amplified signals with equal phase at outputs 206-208.

According to an embodiment, power splitter 204 is formed from a combination of pre-amplifier transistors and delay elements coupled to passive components that are integrally-formed in and/or coupled to Doherty IC 200. In a more specific embodiment, power splitter 204 is a three-branch splitter, where each splitter branch (e.g., branches 401-403, 501-503, FIGS. 4, 5A) has a pre-amplifier coupled to an adjustment element. The adjustment element can correspond to a transmission line having a suitable electrical length, a CLC (capacitor-inductor-capacitor) topology, or combination thereof, as will be described in more detail later. The components of the adjustment element can be configured to have an impedance and phase that optimizes gain, power added efficiency (PAE) and electrical isolation between splitter branches 401-403, 501-503, FIGS. 4, 5A. To increase electrical isolation between the splitter branches 401-403, 501-503, the power splitter 404, 504 can be configured so that each branch has an equal delay in relation to another one of the other branches 401-403, 501-503. Put another way, electrical isolation between branches can be increased as a first combined phase delay of a first branch (e.g., 401, 501) approaches a second combined phase delay of a second branch (e.g., 402, 502). The first combined delay corresponds to a sum of a first phase delay of a first amplifier (e.g., 423, 523) and a second phase delay of a first adjustment element (e.g., 412, 512) of the first branch (e.g., 401, 501). Similarly, the second combined phase delay corresponds to a sum of a third phase delay of a second amplifier (e.g., 439", 539") and a fourth phase delay of a second adjustment element (e.g., 414", 514") of the second branch (e.g., 402, 502).

In an example embodiment, electrical isolation can be substantially achieved by configuring each splitter branch 401-403, 501-503 to have a combined phase delay of approximately 90 degrees. Suppose, for example, the amplifier of each splitter branch 401-403, 501-503 is of a same size having approximately a same phase delay of 55 degrees. In this illustration each splitter branch 401-403, 501-503 can be configured to have the same phase by utilizing an adjustment element with a phase delay of 35 degrees (totaling 90 degrees of phase delay per splitter branch). Electrical isolation between splitter branches 401-403, 501-503 can also be achieved by configuring pairs of splitter branches (e.g., 401 & 403; 401 & 402; 402 & 403) to have a total sum that is at or near 180 degrees so that each splitter branch is at least substantially out of phase with each other and thereby electrically isolated. Such summations are illustrated by path pairs 408, 408' and 408" shown, respectively, in FIG. 4. Power splitter 204, 404 and 504 of FIGS. 2, 4, 5A may provide an advantage over conventional power splitters with only passive components (e.g., inductors, capacitors and/or resistors), in that the multiple-section topology of power splitter 204, 404 and 504 can provide pre-amplification for a single or multi-stage amplifier (e.g., Doherty amplifier) with a better broadband response than a conventional one-section power splitter.

Figure 4:
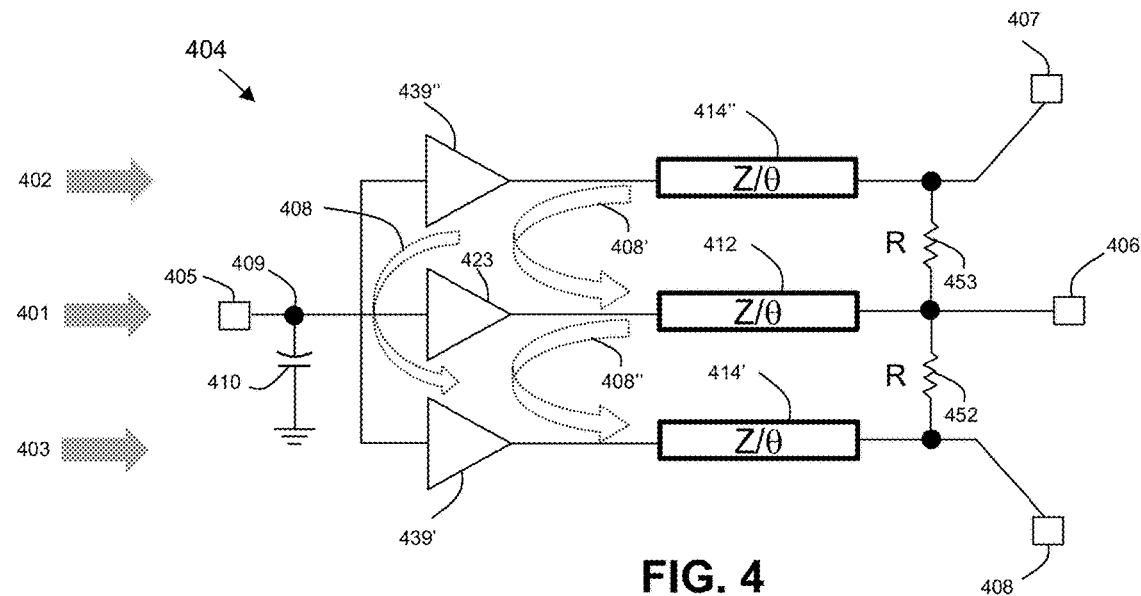
FIG. 4 is a simplified schematic of a power splitter, in accordance with an example embodiment.
Figure 5A:
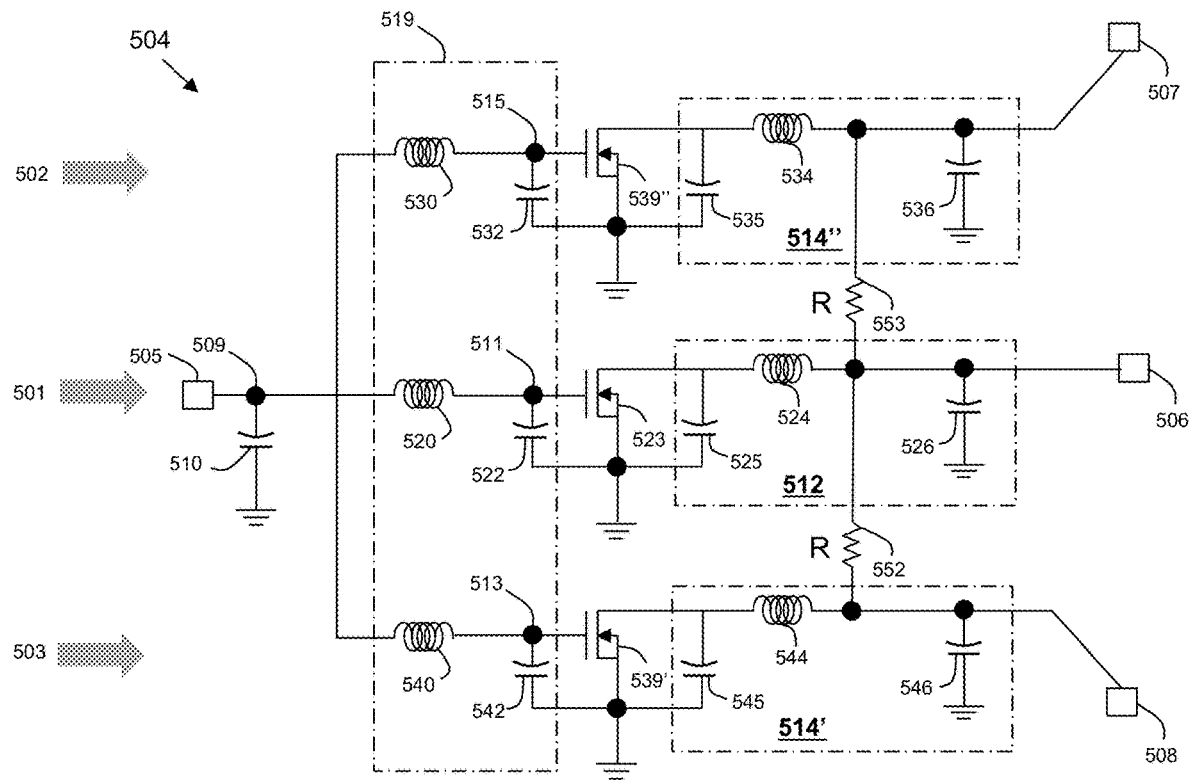
FIG. 5A is an embodiment of the power splitter of FIG. 4, in accordance with an example embodiment.

FIGS. 4 and 5A, illustrate simplified schematic diagrams of integrated signal splitters 404, 504 (e.g., splitter 104, 204, FIGS. 1, 2) suitable for use in Doherty IC 200, in accordance with an example embodiment. Splitter 404, 504 includes a splitter input terminal 405, 505 (e.g., input 105, 205, FIGS. 1, 2) configured to receive an input RF signal, and three splitter branches 401-403, 501-503 coupled between the input terminal 405, 505 and splitter output terminals 406, 506, 407, 507, 408, 508 (e.g., outputs 106-108, 206-208, FIGS. 1, 2).

As can be seen in FIGS. 4 and 5A, each branch 401-403, 501-503 of splitter 404, 504 may include a filter circuit (each including inductor 520, 530, 540 and a capacitor 522, 532, 542, for example), a pre-amplifier 423, 439', 439", 523, 539', 539", and an adjustment element 412, 414', 414", 512, 514', 514". Isolation resistors 452-453, 552-553 are coupled between the branches 401-403, 501-503. Each pre-amplifier 523, 539', 539" shown in FIG. 5A can correspond to one or more transistor fingers (herein referred to as transistor fingers 523, 539', 539"). As will be described in more detail in conjunction with the description of FIGS. 5B-5E, each transistor finger may be configured as a FET with gate, drain, and source terminals. Within each branch 501-503, the filter circuit 519 (including an inductor 520, 530, 540 and a capacitor 522, 532, 542) is coupled between the splitter input terminal 405, 505 and the gate terminal(s) of the transistor finger(s) corresponding to the pre-amplifiers 523, 539', 539".

Each of the filter circuits provided by the inductors 520, 530, 540 and capacitors 522, 532, 542 can serve as a low-pass filter, bandpass filter or high pass filter and/or input impedance matching circuit for signals applied at splitter input terminal 505. Although not shown, pre-driver amplifiers 423, 439', 439" can utilize similar filter circuits as those illustrated in FIG. 5A. The adjustment elements 414', 412, 414", 512, 514', 514" can be implemented with transmission lines having a suitable electrical length, and/or a lumped-element equivalent such as a capacitor-inductor-capacitor (CLC) topology (e.g., CLC 525, 524, 526 for branch 501, CLC 535, 534, 536 for branch 502, or CLC 545, 544, 546 for branch 503). It will be appreciated that the inductors 520, 530, 540 values and capacitors 522, 532, 542 values of each of the filter circuits of filter 519 can differ among the filter circuits. In an embodiment, the capacitor 522, 532, 542 may be implemented solely according to an inherent capacitance of the gate terminal of pre-amplifier 523, 539', 539". In another embodiment, the capacitor 522, 532, 542 may be implemented from a combination of the gate terminal capacitance and other capacitors (not shown in FIG. 5A) coupled to the gate terminal of pre-amplifier 523, 539', 539" to adjust the capacitance to desired values.

The adjustment elements 412, 414', 414", 512, 514', 514" are configured in view of a phase delay and output impedance of each pre-driver amplifier 423, 439', 439", 523, 539', 539" to achieve at least in part an impedance match with the outputs of each pre-driver amplifier 423, 439', 439", 523, 539', 539" and an equal (or substantially equal) phase at the outputs of the splitter branches 401-403, 501-503, in an embodiment. In particular, when all pre-driver amplifiers 423, 439', 439", 523, 539', 539" impart the same delay to signals amplified by the pre-amplifiers, the adjustment elements 412, 414', 414", 512, 514', 514" each also may impart equal delays to those signals (which may or may not be the same as the adjustment elements 412, 414', 414", 512, 514', 514") to ensure that the cumulative delays applied through each branch 401-403, 501-503 are substantially equal. Conversely, when one or more of the pre-driver amplifiers 423, 439', 439", 523, 539', 539" imparts different delays from each other, then the adjustment elements 412, 414', 414", 512, 514', 514" may impart different delays to ensure that the cumulative delays applied through each branch 401-403, 501-503 are substantially equal.

Each inductor (e.g., inductors 520, 524, 530, 534, 540, 544, shown in FIG. 5A) may be implemented, for example, as an integrated spiral inductor formed from patterned conductive layers and vias within the build-up layers of the die 201 (e.g., build-up layers 312, FIG. 3). In alternate embodiments, some or all of the inductors 520, 524, 530, 534, 540, 544 may be implemented as discrete inductors or wirebond arrays coupled to the top surface of the die 201. Each of the inductors 520, 524, 530, 534, 540, 544 may have an inductance value in a range of about 4 nanohenries (nH) to about 9 nH when a center frequency of operation, fo, of the Doherty IC 200 is about 2.0 gigahertz (GHz), although the center frequency of operation and/or the inductance values may be lower or higher, as well. Other inductive values and center frequency of operation, fo, are also contemplated by the subject disclosure.

Capacitors 525, 535, 545 represent the parasitic drain-source capacitance of pre-amplifier transistors 523, 539', 539", and thus are not actual physical components. Conversely, each of capacitors 522, 526, 532, 536, 542, 546 may be an integrated MIM capacitor formed within the build-up layers of the die 201 (e.g., build-up layers 312, FIG. 3), and/or small chip capacitors (discrete capacitors) coupled to the top surface of the die 201, in various embodiments. According to an embodiment, each capacitor 510, 526, 536, 546 is a shunt capacitor, with a bottom electrode coupled to a ground reference using through substrate vias (TSVs) that extend through the base semiconductor substrate (e.g., substrate 310, FIG. 3) to a conductive layer (e.g., layer 328, FIG. 3) on the bottom surface of the die 300. Each of the capacitors 510, 522, 526, 532, 536, 542, 546 may have a capacitance value in a range of about 0.5 picofarads (pF) to about 1.5 pF when a center frequency of operation of the amplifier is about 2.0 GHz, although the center frequency of operation and/or the capacitance values may be lower or higher, as well. Other capacitance values and center frequency of operation, fo, are also contemplated by the subject disclosure.

Referring also to FIGS. 4 and 5A, each power splitter 404, 504 also includes a plurality of resistors (e.g., resistors 452-453, 552-553, FIGS. 4, 5A), in an embodiment, and as will be described in more detail below. The resistors 452-453, 552-553 may be, for example, integrated resistors (e.g., formed from polysilicon within the build-up layers of die/substrates 201, 582, 587, 592, 597, FIGS. 3, 5B-5E), or small discrete resistors coupled to the top surface of the die 201 or substrate 582, 587, 592, 597. Each of the resistors 452-453, 552-553 may have a resistance value in a range of about 50 ohms to about 250 ohms, although the resistance values may be lower or higher, as well.

Beginning at the splitter input terminal 405, 505, a first shunt capacitor 410, 510 is electrically coupled between the input terminal 405, 505 and a dividing node 409, 509 for the three branches 401-403, 501-503. Each splitter branch 401-403, 501-503 can be a three-section branch having an input impedance matching and/or filter section.

Although not shown in FIG. 4, the shunt capacitor 410 can be coupled to the input impedance matching and/or filter section in each of branches 401-403, respectively. In an embodiment, the input impedance matching and/or filter section can be included in the pre-driver amplifiers 423, 439', 439". The adjustment elements 412, 414', 414" can be implemented with transmission lines having an electrical length that achieves a combined phase delay for each of the splitter branches 401-403 that satisfies impedance matching of the pre-driver amplifier outputs and the electrical isolation conditions between paths 408, 408', 408" as discussed earlier. Alternatively, as illustrated in FIG. 5A, the adjustment elements 412, 414', 414" can be implemented with CLC circuits that provide a desired impedance match and delay to achieve gain, PAE, and the electrical isolation conditions between paths 408, 408', 408". Each adjustment element 412, 414', 414" has a first terminal coupled to a drain terminal of the pre-driver amplifier 423, 439', 439", and a second terminal coupled to an output terminal 406-408. To provide further isolation between the splitter branches 401-403, resistors 452-453 can be coupled between output terminals 406-408.

In the embodiment of FIG. 5A, filter 519 can be implemented as impedance matching networks (in a CLC or pi-type topology) that are coupled respectively to amplifiers 523, 539', 539" that are in turn coupled to CLC circuits 512, 514', 514" in series between the splitter input terminal 505 and a splitter output terminal 506-508. A first section of each branch 501-503 includes a matching network that is defined by the first shunt capacitor 510, a first inductor 520, 530, 540, and a second shunt capacitor 522, 532, 542 (which may correspond solely to the inherent gate capacitance of amplifiers 523, 539', 539" or a capacitance based on the gate capacitance combined with other capacitors not shown in FIG. 5A). Each first inductor 520, 530, 540 has a first terminal coupled to the input terminal 505 (or to dividing node 509), and a second terminal coupled to an inter-section node 511, 513, 515. Each second shunt capacitor 522, 532, 542 is electrically coupled between the inter-section node 511, 513, 515 and the ground reference. A second section of each branch 501-503 includes the amplifier 523, 539', 539", which includes a control (gate) terminal coupled to the inter-section node 511, 513, 515, a drain terminal coupled to CLC circuits 512, 514', 514", and a source terminal coupled to the ground reference.

As shown in FIG. 5A, the CLC circuit section corresponding to adjustment elements 512, 514', 514" is defined by the second shunt capacitor 525, 535, 545 coupled to a ground reference, a second inductor 524, 534, 544, and a third shunt capacitor 526, 536, 546 coupled to the ground reference. The second shunt capacitor 525, 535, 545 which may correspond solely to the inherent drain capacitance of amplifiers 523, 539', 539" or a capacitance based on the drain capacitance combined with other capacitors not shown in FIG. 5A. Each second inductor 524, 534, 544 has a first terminal coupled to the drain terminal of the amplifier 523, 539', 539", and a second terminal coupled to an output terminal 506-508. Each third shunt capacitor 526, 536, 546 is electrically coupled between an output terminal 506-508 and the ground reference. According to an embodiment, each first inductor 520, 530, 540 is significantly larger (e.g., between about 10 percent and 100 percent larger) in inductance value than each second inductor 524, 534, 544. In alternate embodiments, the first and second inductors may have substantially identical inductance values, or each second inductor 524, 534, 544 may be significantly larger in inductance value than each first inductor 520, 530, 540.

Although FIGS. 4 and 5A depict multiple-section splitters 404, 504 that can include three splitter sections (CLC, amplifier, CLC) in each branch 401-403, 501-503, alternate embodiments may include more than three (e.g., four, or more) sections or less than three (e.g., two) sections in each branch 501-503. In addition, other alternate embodiments that include a single peaking amplifier may include only two branches (e.g., one branch for the main amplifier and one branch for the single peaking amplifier), as discussed in conjunction with FIG. 5B. Still other alternate embodiments that include more than two peaking amplifier portions (or more than one divided peaking amplifier) may include more than three branches (e.g., one branch for the main amplifier and one branch for each peaking amplifier or peaking amplifier portion). Although FIGS. 4 and 5A depict a particular integrated signal splitter configuration, other types or configurations of signal splitters may be used, in other embodiments.

FIGS. 5B, 5C, 5D and 5E depict embodiments of pre-driver amplifiers 580, 585, 590, 595 (e.g., pre-driver amplifiers 423, 439', 439", 523, 539', 539" of the power splitter 404, 504 of FIGS. 4 and 5A), that are implemented using various transistor finger configurations, in accordance with various example embodiments. To simplify the illustration of the various configurations for the pre-driver amplifiers of FIGS. 4 and 5A, implementations of the adjustment elements or input filter circuits shown in FIGS. 4 and 5A are not depicted in FIGS. 5B-5E. The adjustment elements or input filter circuits can be readily included on the same die as the pre-driver amplifiers shown in FIGS. 5B-5E or separate dies interconnected with the pre-driver amplifiers of FIGS. 5B-5E. With this in mind, each of the pre-amplifiers 580, 585, 590, 595 are integrally formed in a semiconductor substrate 582, 587, 592, 597, such as a silicon, GaN, or other suitable substrate. Pre-amplifiers 580, 585, 590, 595 have a plurality of gate manifolds, each corresponding to one or a combination of the splitter inputs. Pre-amplifiers 580, 585, 590, 595 also have a plurality of drain manifolds, each coupling to a corresponding adjustment element.

Pre-amplifier 580 has a drain manifold 572, which corresponds to a first amplifier output (path 501 of FIG. 5A) that couples to an adjustment element 512, which in turn is configurable for coupling to a main amplifier path (not shown in FIG. 5B), and drain manifold 573, which corresponds to a second amplifier output (path 502 or 503 of FIG. 5A) that couples to an adjustment element 514' or 514" (see FIG. 5A) configurable for coupling to a peaking amplifier path (not shown). Pre-amplifiers 585, 590, 595 have drain manifolds 575, 576, 578, 579, 584, 586, which can correspond to first and second amplifier outputs (paths 502 and 503 of FIG. 5A) that each couple to a corresponding adjustment element 514", 514' configurable for coupling to corresponding first and second peaking amplifier paths (not shown), and drain manifolds 574, 577, 583, which can correspond to a third amplifier output that couples to an adjustment element 512 configurable for coupling to a main amplifier path (not shown).

In some embodiments, the pre-amplifiers 582, 587, 592, 597 may be integrally formed in the same semiconductor substrate as the multi-path amplifier to which the splitter couples to (e.g., substrate 201, FIG. 2). In other embodiments, the pre-amplifiers 580, 585, 590, 595 may be formed in a separate semiconductor substrate independent from the substrate of the multi-path amplifier, where the separate semiconductor substrate is directly coupled to the multi-path amplifier semiconductor substrate, or is packaged as a surface-mount device that is coupled to the multi-path amplifier semiconductor substrate. As noted above, the illustrations of FIGS. 5B-5E represent transistor fingers without showing the adjustment elements 412, 414', 414", 512, 514', 514" of FIGS. 4 and 5A. To achieve an equal phase between splitter branch 401-403, 501-503, adjustment elements 412, 414', 414", 512, 514', 514" can be configured with a proper phase delay and with impedance matching characteristics for coupling to an output (drain manifold) terminal of the transistor fingers of FIGS. 5B-5E.

Figure 5B:
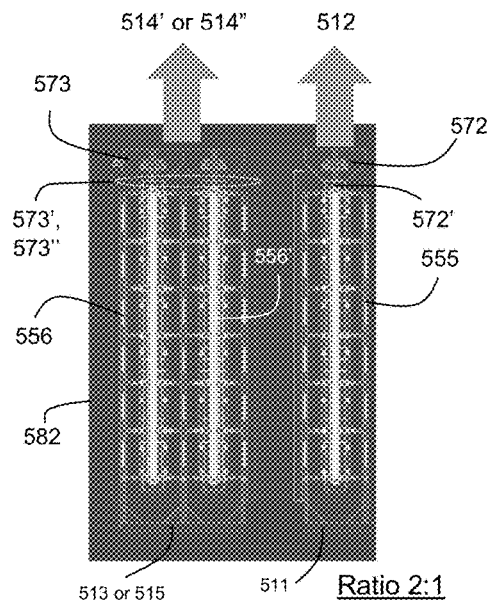
FIGS. 5B, 5C, 5D and 5E depict embodiments of "transistor finger" configurations that can be utilized to implement the power splitter of FIGS. 4 and 5A, in accordance with example embodiments.

Each transistor finger (555, 556, 556', 557, 558, 558', 560, 561, 561', 561", 562, 563, 563', 563") of FIGS. 5B-5BE includes a gate terminal 511, 513, 515 (or control terminal), a drain terminal 572', 573', 573", 574', 575', 576', 577', 578', 578", 579', 583', 584', 584", 586' (or first current-carrying terminal), and a source terminal (or second current-carrying terminal), not numbered and not shown. In a specific embodiment, each transistor finger 555, 556, 556', 557, 558, 558', 560, 561, 561', 561", 562, 563, 563', 563" is an LDMOS FET, which includes an active area disposed between gate and drain terminals. As described previously, each active area includes a plurality of elongated, parallel-aligned, and interdigitated drain regions and source regions, where each drain region and each source region is a doped semiconductor region formed in the base semiconductor substrate.

A variably-conductive channel (and, in some embodiments, a drain drift region) is present between adjacent source and drain regions. Conductive (e.g., polysilicon or metal) gate structures formed over the base semiconductor substrate are coupled to and extend from each gate terminal 511, 513, 515 over and along the channel regions. Similarly, additional conductive (e.g., polysilicon) drain structures formed over the base semiconductor substrate are coupled to and extend from each drain terminal 572', 573', 573", 574', 575', 576', 577', 578', 578", 579', 583', 584', 584", 586' over and along the drain regions. The source regions are electrically coupled to conductive (e.g., polysilicon or metal) source contacts, which in turn are coupled to conductive TSVs that extend through the base semiconductor substrate to connect with a conductive layer on the bottom surface of the base semiconductor substrate. Voltages applied to the gate terminals 511, 513, 515 during operation modulate the conductivity of the variably-conductive channels, thus enabling current flow between source and drain regions (or ultimately between the conductive layer on the bottom surface and each drain terminal 572', 573', 573", 574', 575', 576', 577', 578', 578", 579', 583', 584', 584", 586'. In the embodiments of FIGS. 5B-5E, the gate terminals of transistor fingers 556, 556', 561, 561', 563, 563' are electrically connected together, while the gate terminals of transistor fingers 555, 557, 558, 558', 560, 561", 562, 563" are electrically isolated from each other and electrically isolated from transistor fingers 556, 556', 561, 561', 563, 563'.

In FIG. 5B, the drain terminal 572' of finger 555 is connected to a first drain manifold 572, and the drain terminals 573', 573" of fingers 556 and 556' are electrically connected together with a second drain manifold 573 that is electrically isolated from the first drain manifold 572. In the embodiment of FIG. 5B, each of the transistor fingers 555, 556, 556' has a same size (or length, or periphery). Accordingly, each of the transistor fingers 555, 556, 556' provides the same level of signal amplification. Because the drain terminals 573', 573" of fingers 556 and 556' are electrically connected with drain manifold 573, during operation, the signal power at drain manifold 573 (which is provided to the peaking amplifier path) is about twice the signal power at drain manifold 572 (which is provided to the main amplifier path).

Figure 5C:
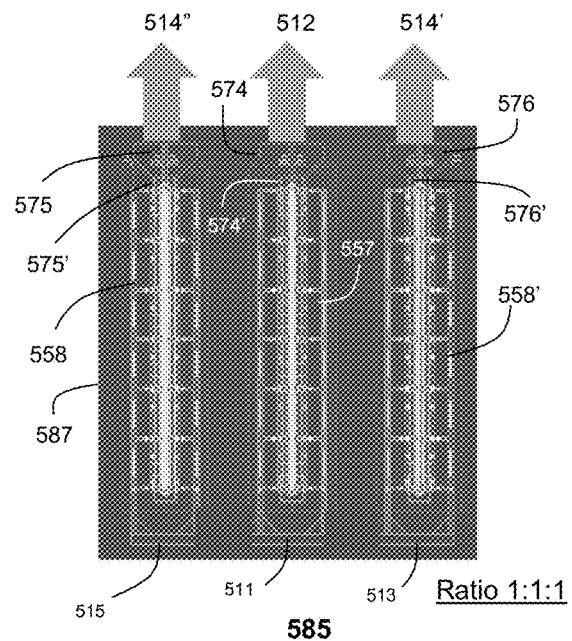

In FIG. 5C, the drain terminal 574' of finger 557 is connected to a first drain manifold 574, and the drain terminals 575' and 576' of fingers 558 and 558' are electrically connected to second and third drain manifolds 575 and 576 that are electrically isolated from the first drain manifold 574 and each other. In the embodiment of FIG. 5C, each of the transistor fingers 557, 558, 558' has a same size (or length, or periphery). Accordingly, each of the transistor fingers 557, 558, 558' provides the same level of signal amplification. Because the drain terminals 575', 576' of fingers 558 and 558' are electrically connected respectively with drain manifolds 575 and 576, during operation, the combined signal power at drain manifolds 575 and 576 (which is provided to corresponding peaking amplifier paths) is about twice the signal power at drain manifold 574 (which is provided to the main amplifier path).

Figure 5D:
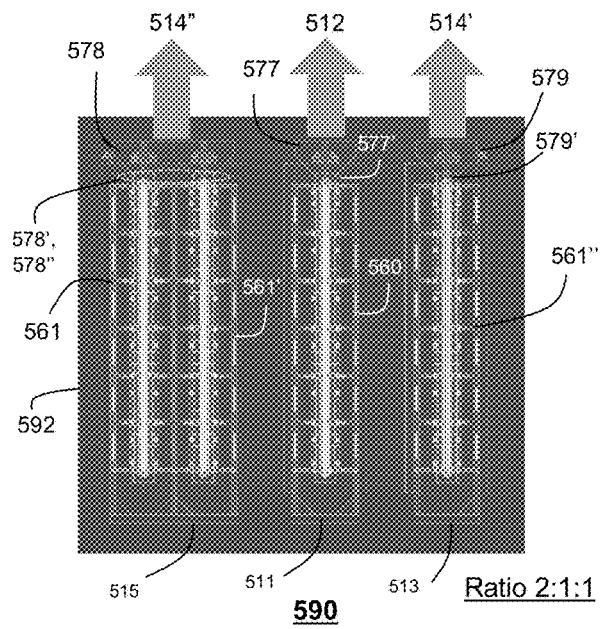

In FIG. 5D, the drain terminal 577' of finger 560 is connected to a first drain manifold 577, and the drain terminals 578', 578" and 579' of fingers 561, 561' and 561" are electrically connected, respectively, to second and third drain manifolds 578 and 579 that are electrically isolated from the first drain manifold 577 and each other. In the embodiment of FIG. 5D, each of the transistor fingers 560, 561, 561', 561" has a same size (or length, or periphery). Accordingly, each of the transistor fingers 560, 561, 561', 561" provides the same level of signal amplification. Because the drain terminals 578', 578", 579' of fingers 561, 561', 561" are electrically connected, respectively, with drain manifolds 578 and 579, during operation, the combined signal power at drain manifolds 578 and 579 (which is provided to corresponding peaking amplifier paths) is about three-times the signal power at drain manifold 577 (which is provided to the main amplifier path).

Figure 5E:
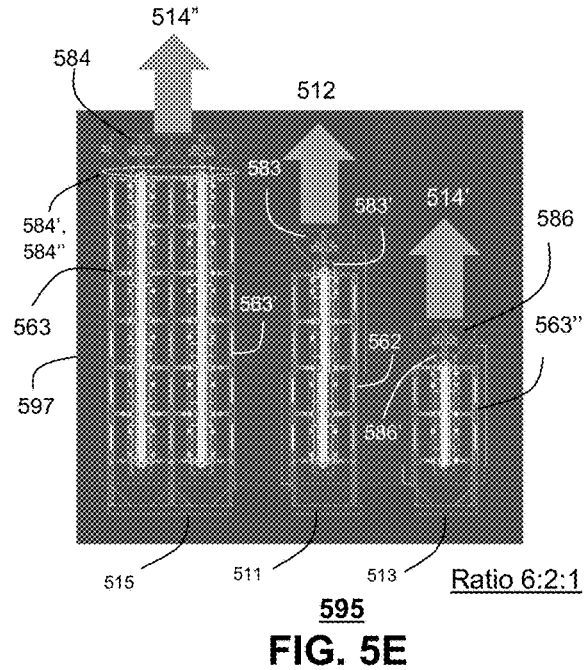

In FIG. 5E, the drain terminal 583' of finger 562 is connected to a first drain manifold 583, and the drain terminals 584', 584" and 586' of fingers 563, 563' and 563" are electrically connected, respectively, to second and third drain manifolds 584 and 586 that are electrically isolated from the first drain manifold 583 and each other. In the embodiment of FIG. 5E, transistor finger 562, transistor fingers 563, 563' (of a same size or length, or periphery), and transistor finger 563" differ from each other in size and amplification. In an embodiment, the combination of transistor fingers 563, 563' is three-times the size of transistor finger 562 and six-times the size of transistor finger 563", thereby providing a signal amplification ratio of 6:2:1.

In an asymmetric Doherty amplifier configuration as described earlier, the peaking amplification path may be larger in size (i.e., higher current carrying capability) than the main amplification path. For example, a Doherty amplifier with a 2:1 peaking-to-main power ratio has a peaking amplification path that is twice the size of the main amplification path. To achieve a 2:1 ratio in a Doherty amplifier having a single peaking path that is twice the size of a main amplification path, the power splitter 404, 504 can be configured to use the 2:1 finger transistor ratio of FIG. 5B. In this configuration, a main splitter branch (e.g., 401-501) of the power splitter 404, 504 can utilize one or more first transistor fingers (e.g., transistor finger 555) to supply a first portion (e.g., one-third) of the input signal power to the main amplification path of the Doherty amplifier, while a peaking splitter branch (e.g., 402-502 or 403-503) of the power splitter 404, 504 can utilize one or more second transistor fingers (e.g., transistor fingers 556, 556') to supply a second portion (e.g., two-thirds) of the input signal power to the single peaking amplification path of the Doherty amplifier.

To achieve a 2:1 ratio in a Doherty amplifier having split peaking paths that together add up to twice the size of a main amplification path, the power splitter 404, 504 can be configured to use the 1:1:1 finger transistor ratio of FIG. 5C. In this configuration, a main splitter branch (e.g., 401-501) of the power splitter 404, 504 can utilize one or more first transistor fingers (e.g., transistor finger 557) to supply a first portion (e.g., one-third) of the input signal power to the main amplification path of the Doherty amplifier. Additionally, a first peaking branch (e.g., 402-502) of the power splitter 404, 504 can utilize one or more second transistor fingers (e.g., transistor finger 558) to supply a second portion (e.g., one-third) of the input signal power to a first peaking amplification path of the Doherty amplifier, while a second peaking branch (e.g., 403-503) of the power splitter 404, 504 can utilize the single transistor finger 558' to supply one-third of the input signal power to a second peaking amplification path of the Doherty amplifier.

The finger transistors of FIGS. 5D-5E can be used by the power splitter 404, 504 to support other asymmetric Doherty amplifier configurations with power ratios such as 2:1:1 and 6:2:1, respectively. For example, an asymmetric Doherty amplifier can be configured with split peaking amplification paths in which one peaking amplification path is twice the size of the other peaking amplification path and twice the size of the main amplification path (hence, a 2:1:1 power ratio). To achieve a 2:1:1 asymmetric Doherty amplifier, the main splitter branch 401, 501 of the power splitter 404, 504 can be configured with the single transistor finger 560 of FIG. 5D to supply one-quarter the input signal power to the main amplification path. Similarly, a first peaking splitter branch 402, 502 can be configured to use the single transistor finger 561" to supply one-quarter the input signal power to the smaller peaking amplification path of the Doherty amplifier, while the other peaking splitter branch 403, 503 can be configured to use dual transistor fingers 561, 561' (with a shared output (drain) terminal) to supply half the input signal power to the larger peaking amplification path. Utilizing similar principles, the splitter branches 401-501, 402-502, 403-503 of the power splitter 404, 504 can be configured to use the finger transistors 562, 563, 563', 563" to support an asymmetric Doherty configuration having a power ratio of 6:2:1.

Figure 5G:
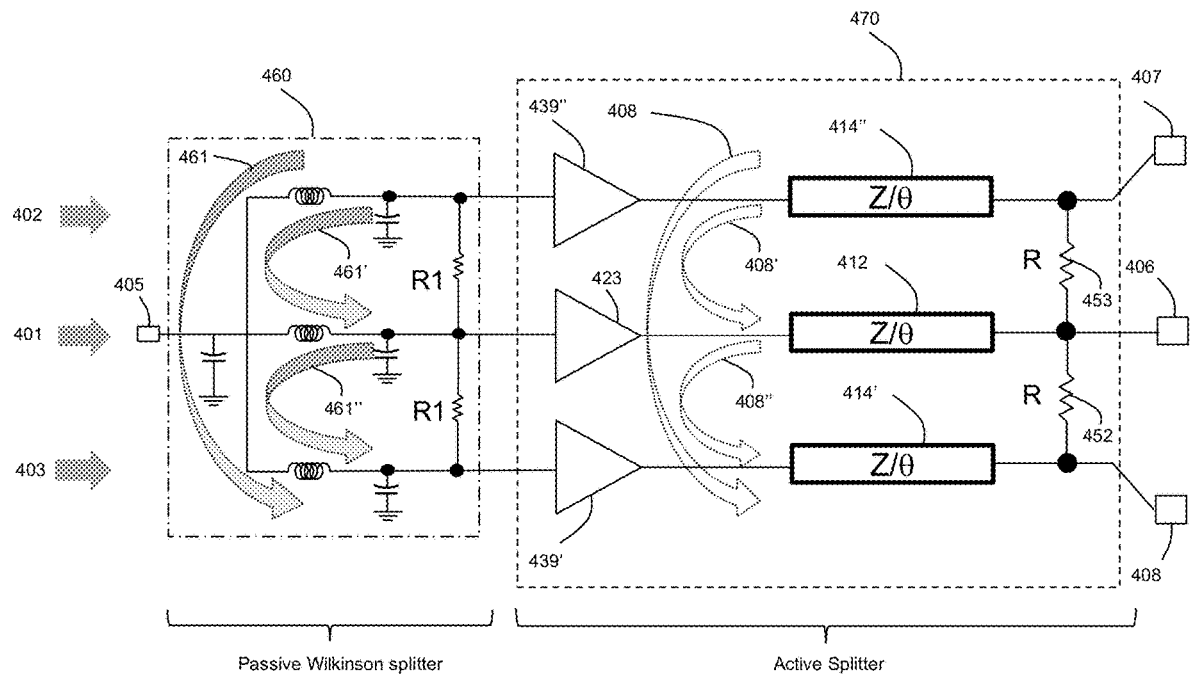
FIGS. 5G-5H depict alternative embodiments of the power splitters of FIGS. 4 and 5A, respectively, in accordance with example embodiments.
Figure 5H:
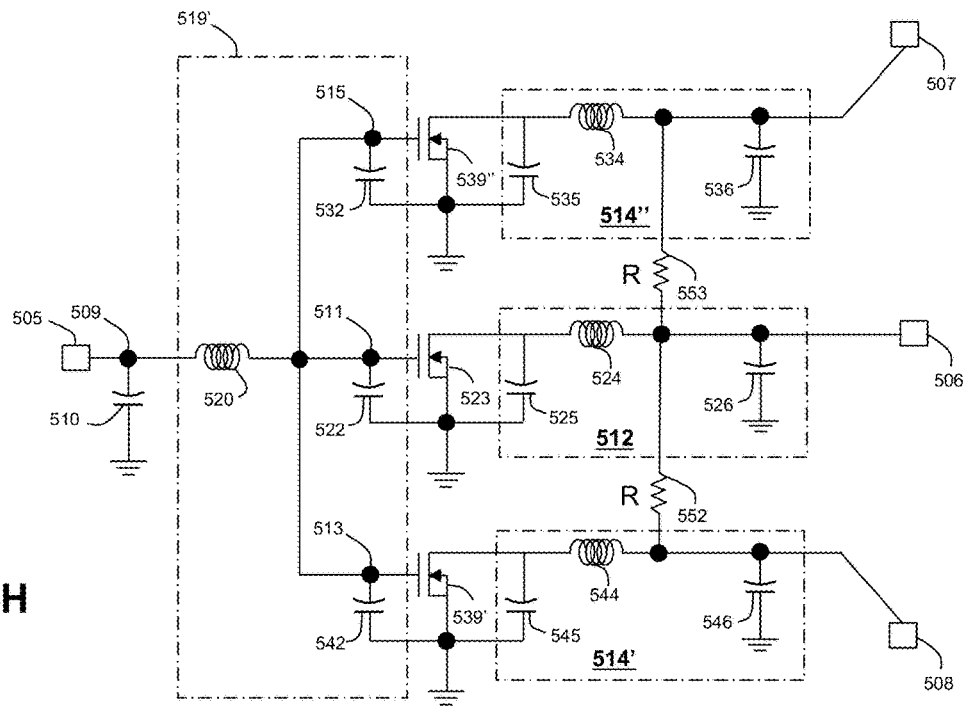

FIGS. 5G-5H depict alternative embodiments of the power splitters of FIGS. 4 and 5A, respectively, in accordance with example embodiments. FIG. 5G combines a passive Wilkinson splitter 460 at the inputs of an active splitter 470. In this configuration, the two resistors R1 of the passive Wilkinson splitter 460 serve to provide isolation between the branches 401-403 of the passive Wilkinson splitter 460. The passive Wilkinson splitter 460 can be configured so that path 461 has a total phase of 180 degrees (90 degrees for branch 402 plus 90 degrees for branch 403) which results in branches 402-403 of the passive Wilkinson splitter 460 being out-of-phase and thereby electrically isolated. Similarly, the passive Wilkinson splitter 460 can be configured so that path 461' has a total phase of 180 degrees (90 degrees for branch 402 plus 90 degrees for branch 401) which results in branches 401 and 402 of the passive Wilkinson splitter 460 being out-of-phase and thereby electrically isolated. Also, the passive Wilkinson splitter 460 can be configured so that path 461" has a total phase of 180 degrees (90 degrees for branch 401 plus 90 degrees for branch 403) which results in branches 401 and 403 of the passive Wilkinson splitter 460 being out-of-phase and thereby electrically isolated. The passive Wilkinson splitter 460 can also be configured to match at least in part the impedance of the input terminal 405. The capacitors shown in the passive Wilkinson splitter 460 can represent the gate capacitance of each of the amplifiers 423, 439' and 439", respectively.

Turning to the active splitter 470, the two resistors 452-453 provide isolation between the branches 401-403 of the active splitter 470. Path 408 of the active splitter 470 has a total phase of 180 degrees (90 degrees for branch 402 plus 90 degrees for branch 403) which results in branches 402-403 of the active splitter 470 being out-of-phase and thereby electrically isolated. Similarly, path 408' has a total phase of 180 degrees (90 degrees for branch 402 plus 90 degrees for branch 401) which results in branches 401 and 402 of the active splitter 470 being out-of-phase and thereby electrically isolated. Also, path 408" has a total phase of 180 degrees (90 degrees for branch 401 plus 90 degrees for branch 403) which results in branches 401 and 403 of the active splitter 470 being out-of-phase and thereby electrically isolated. The embodiment of FIG. 5G demonstrates alternative configurations of the embodiment of FIG. 4 with passive and active configurations. The active splitter 470 also provides isolation between paths and an improved broadband frequency response. The adjustment elements 412, 414', 414" of the active splitter are configurable to match at least in part the impedance of the outputs of the amplifiers 423, 439', 439" and add a phase delay that achieves the 180 degree phase in paths 408, 408', 408" to maintain isolation between batches 401, 402, 403.

Figure 5I:
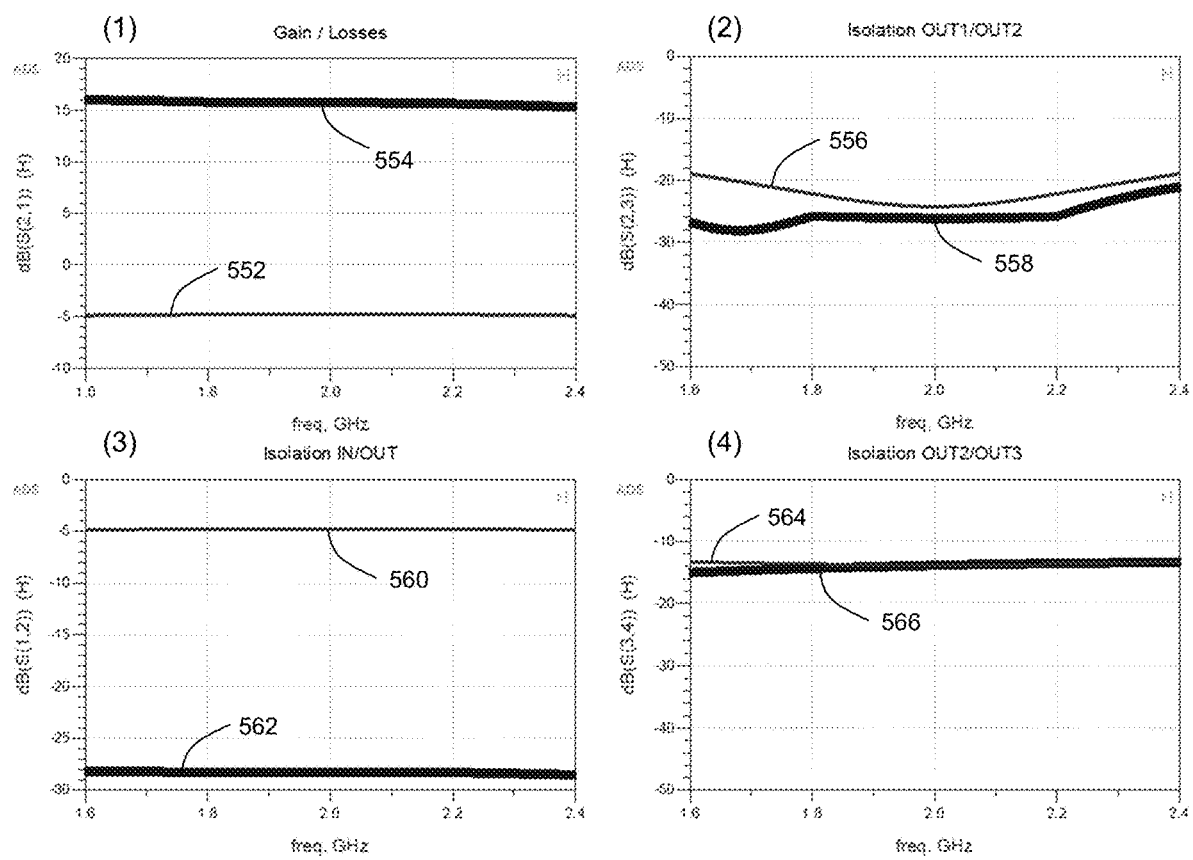
FIG. 5I depicts plots that compare a performance of the power splitter of FIGS. 4 and 5A to passive splitters, in accordance with an example embodiments.

Turning to FIG. 5H, in this embodiment, the gate terminals 511, 513 and 515 of amplifiers 523, 539', and 539" are electrically connected together. Capacitors 522, 532, and 542 can represent the gate capacitances of amplifiers 523, 539', and 539", respectively. Inductor 520 can represent a wirebond to the shared gate terminal. The combination of capacitor 510, inductor 520, and parallel capacitors 522, 532, 542 can form a CLC filter 519' configurable to match the input impedance at input 505. The remaining components shown in FIG. 5H operate as described in FIG. 5A. FIG. 5I depicts plots that compare a performance of the power splitter 404, 504 of FIGS. 4 and 5A to passive splitters, in accordance with an example embodiment. FIG. 5I(1) illustrates that the power splitter 404, 504 of FIGS. 4 and 5A can be configured to have 20 dB more gain (e.g., 554) than a passive splitter at approximately −5 dB (e.g., 552). FIG. 5I(2) further illustrates that the power splitter 404, 504 can have an electrical isolation (e.g., 558) between output terminals of main and peaking amplification paths 401-501, 402-403, 502-503 that is similar to the electrical isolation (e.g., 556) of output terminals of main and peak paths of a passive splitter. FIG. 5I(3) also illustrates that the input-to-output electrical isolation of the power splitter 404, 504 shown at approximately −27 dB is an improvement of approximately 22 dB (e.g., 562) over the input-to-output electrical isolation of a passive splitter (e.g., 560) at approximately −5 dB. FIG. 5I(4) further illustrates that the power splitter 404, 504 has an electrical isolation (e.g., 566) between peaking amplification paths 402-403, 502-503 that is similar to the electrical isolation (e.g., 564) between peaking amplification paths of a passive splitter.

Referring again to FIG. 2, output 206 (e.g., output 406, 506, FIGS. 4, 5A) of power splitter 204 is electrically connected to the input 221 of the main amplifier 220 through a conductive path implemented in the build-up layers 312 of the Doherty IC 200. According to an embodiment, outputs 207, 208 (e.g., outputs 407, 507, 408, 508, FIGS. 4, 5A) of power splitter 204 are electrically connected to the inputs 241', 241" of the peaking amplifier portions 240', 240" through input phase delay circuits 209', 209" (e.g., input phase delay circuits 109', 109", FIG. 1) and additional conductive paths implemented in the build-up layers 312 of the Doherty IC 200. The input phase delay circuits 209', 209" are configured to ensure that the peaking input signals at the inputs 241', 241" to the peaking amplifier portions 240', 240" have about 90 degrees of phase difference from the main input signal at the input 221 to the main amplifier 220.

Each of the main amplifier 220 and the peaking amplifier portions 240', 240" may have a substantially similar configuration, in an embodiment. According to an embodiment, each amplifier 220, 240', 240" is a two-stage amplifier, which includes a relatively low-power driver amplifier 226, 246', 246" (or driver amplifier FET) and a relatively high-power final-stage amplifier 230, 250', 250" (or final-stage amplifier FET) connected in a cascade arrangement between an amplifier input 221, 241', 241" and a combining node structure 290.

In the main amplifier 220, an input 221 of the amplifier 220 is coupled through an input impedance matching network 222 (e.g., IMN 122, FIG. 1) to an input terminal 225 (e.g., gate terminal) of driver amplifier FET 226, an output 227 (e.g., drain terminal) of the driver amplifier FET 226 is electrically coupled through an inter-stage impedance matching network 228 (e.g., ISMN 128, FIG. 1) to an input terminal 229 (e.g., gate terminal) of final-stage amplifier FET 230. Similarly, in each of the peaking amplifier portions 240', 240", an input 241', 241" of the amplifier 240', 240" is coupled through an input impedance matching network 242', 242" (e.g., IMNs 142', 142", FIG. 1) to an input terminal 245', 245" (e.g., gate terminal) of driver amplifier FET 246', 246", an output 247', 247" (e.g., drain terminal) of the driver amplifier FET 246', 246" is electrically coupled through an inter-stage impedance matching network 248', 248" (e.g., ISMN 148', 148", FIG. 1) to an input terminal 249', 249" (e.g., gate terminal) of final-stage amplifier FET 250', 250". The source terminals of each of FETs 226, 230, 246', 246", 250', 250" are electrically coupled to a ground reference (e.g., using TSVs through the base semiconductor substrate 310 to a bottom conductive layer 328, FIG. 3).

Each driver amplifier FET 226, 246', 246" may be equal in size, in an embodiment, and may configured to apply a gain to a respective input RF signal in a range of about 15 decibels (dB) to about 25 dB when the Doherty IC 200 is operating in a high-power mode (e.g., close to compression), although only driver amplifier FET 226 provides gain to its input signal when the Doherty IC 200 is operating in a low-power mode. The final-stage amplifier FETs 230, 250', 250" are significantly larger than the driver amplifier FETs 226, 246', 246" (e.g., at least twice as large to apply at least twice the gain). Each final-stage amplifier FET 230, 250', 250" also may be equal in size, in an embodiment, and may be configured to apply a gain to a respective input RF signal in a range of about 15 dB to about 25 dB when the Doherty IC 200 is operating in a high-power mode (e.g., close to compression), although only final-stage amplifier FET 230 provides gain to its input signal when the Doherty IC 200 is operating in a low-power mode.

According to an embodiment, gate bias voltages for each of the FETs 226, 230, 246', 246", 250', 250" are provided through resistor-divider gate bias circuits 270, 270', 270" (e.g., resistor-divider gate bias circuits 170, 170', 170", FIG. 1). As indicated previously, for proper operation of Doherty amplifier IC 200, the main amplifier 220 is biased to operate in class AB mode, and the peaking amplifier portions 240', 240" typically are biased to operate in class C mode. In some configurations, the peaking amplifier portions 240', 240" may be biased to operate in class B or deep class B modes. Because the main amplifier 220 is biased differently from the peaking amplifier portions 240', 240", the main amplifier resistor-divider gate bias circuit 270 is distinct from (and not electrically connected to) the peaking amplifier resistor-divider gate bias circuits 270', 270". However, since the peaking amplifier portions 240', 240" are biased the same as each other, the peaking amplifier resistor-divider gate bias circuits 270', 270" may be identical and electrically connected together, as is shown in the embodiment of FIG. 2.

In the illustrated embodiment, the main amplifier resistor-divider gate bias circuit 270 includes an input terminal 271, resistors 273, 274, and RF isolation circuits 275, 276. Similarly, the peaking amplifier resistor-divider gate bias circuits 270', 270" each include an input terminal 271', resistors 273', 273", 274', 274" and RF isolation circuits 275', 275", 276', 276". In addition to the gate bias circuits 270, 270', 270", Doherty amplifier IC 200 also may include one or more drain bias circuits 282. According to an embodiment, a drain bias circuit 282 includes an input terminal 284 and RF isolation circuits 286, 286', 286". The outputs (i.e., drain terminals 231, 251', 251") of each of the final-stage amplifier FETs 230, 250', 250" are electrically connected to combining node structure 290 (e.g., combining node structure 190, FIG. 1), which functions to combine the amplified RF signals produced by each of the final-stage amplifier FETs 230, 250', 250" into a single amplified output RF signal.

Combining node structure 290 includes an elongated conductive bondpad that is exposed at the top surface of die 201. According to an embodiment, the length of the combining node structure 290 extends from the outside end 252' of the drain terminal 251' of peaking amplifier final stage FET 250' to the outside end 252" of the drain terminal 251" of peaking amplifier final stage FET 250". As illustrated in FIG. 2, combining node structure 290 has three sections, including a leftmost section that is electrically connected to the drain terminal 251' of peaking amplifier final-stage FET 250', a central section that is electrically connected (through wirebonds 238) to the drain terminal 231 of main amplifier final-stage FET 230, and a rightmost section that is electrically connected to the drain terminal 251" of peaking amplifier final-stage FET 250". According to an embodiment, the combining node structure 290 is a continuous conductive bondpad, although the combining node structure 290 could include discontinuous but electrically connected sections, as well.

Desirably, the drain terminals 251', 251" are connected to the combining node structure 290 with conductive paths having a negligible phase delay (i.e., as close to zero degrees of phase delay as possible, such as 10 degrees or less of phase delay), and in some embodiments, the drain terminals 251', 251" may be integrally formed portions of the combining node structure 290. In other words, the drain terminal manifold of the peaking amplifier final-stage FETs 250', 250" may form portions of the combining node structure 290, in some embodiments. As mentioned previously, base semiconductor substrate 310 is a high-resistivity substrate, and therefore potentially high losses that might otherwise occur with a relatively long transmission line (such as combining node structure 290) on a relatively low-resistivity substrate are significantly reduced in Doherty amplifier IC 200.

As mentioned previously, to compensate for the 90 degree phase delay difference between the main and peaking amplification paths at the inputs of amplifiers 220, 240', 240" (i.e., to ensure that the amplified signals are combined in phase at the combining node structure 290), an output phase delay circuit 236 (e.g., circuit 136, FIG. 1) is electrically coupled between the output (i.e., drain terminal 231) of the main amplifier final-stage FET 230 and the outputs (i.e., drain terminals 251', 251") of the peaking amplifier final-stage FETs 250', 250". Specifically, the output phase delay circuit 236 is configured to result in a phase difference that is substantially equal to 90 degrees (i.e., 90 degrees+/−10 degrees) between an RF signal at the drain terminal 231 of the main amplifier final-stage FET 230 and RF signals at the drain terminals 251', 251" of the peaking amplifier final-stage FETs 250', 250".

According to an embodiment, the output phase delay circuit 236 has a CLC (capacitance-inductance-capacitance) topology between drain terminal 231 and drain terminals 251', 251". The first (shunt) capacitance includes the drain-source capacitance, $C_{dsM}$, of the main amplifier final-stage FET 230. A plurality of wirebonds 238 are electrically connected between the drain terminal 231 of the main amplifier final-stage FET 230 and combining node structure 290. More specifically, first ends of the wirebonds 238 are connected to the drain terminal 231, and second ends of the wirebonds 238 are connected to the combining node structure 290. The inductance in the CLC topology of the output phase delay circuit 236 is provided by the series combination of wirebonds 238 and portions of the combining node structure 290 that extend between the landing points of the wirebonds 238 on the structure 290 and the drain terminals 251', 251" of the peaking amplifier final-stage FETs 250', 250". According to an embodiment, the series combination of the wirebonds 238 and those portions of the combining node structure 290 have a combined inductance in a range of about 0.8 nH to about 1.2 nH at a center frequency of operation of about 2.0 GHz, although the center frequency and/or the combined inductance could be lower or higher, as well.

Figure 7:
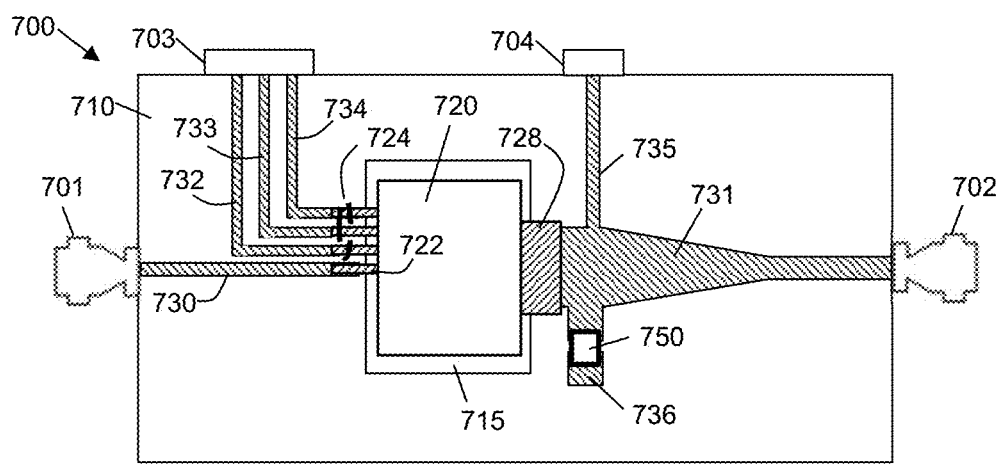
FIG. 7 is a top view of a packaged Doherty amplifier device coupled to a printed circuit board substrate, in accordance with an example embodiment.

Finally, the second (shunt) capacitance in the CLC topology of the output phase delay circuit 236 approximately equals the combined drain-source capacitances, $C_{dsP}$, of the peaking amplifier final-stage FETs 250', 250" minus a portion of $C_{dsP}$ that is compensated for by a shunt inductance (e.g., shunt inductor 750, FIG. 7). To summarize, the 90 degree phase difference between drain terminal 231 and drain terminals 251', 251" is provided by an output phase delay circuit 236 with a CLC topology, where that topology includes a first shunt capacitance (provided by $C_{dsM}$), a series inductance (provided by wirebonds 238 and portions of combining node structure 290), and a second shunt capacitance (provided by $A \times C_{dsP}$, where $A<1.0$).

Doherty power amplifier IC 200 may be packaged and/or incorporated into a larger electrical system in a variety of ways. For example, Doherty IC 200 may be packaged within an overmolded or air-cavity power device package (e.g., package 604, FIG. 6). Alternatively, Doherty IC 200 may be packaged in a surface-mount type of package, such as a no-leads package (e.g., a dual-flat no leads (DFN) or quad-flat no leads (QFN) package). In still other embodiments, Doherty IC 200 may be mounted directly to a module or PCB substrate surface.

By way of example, FIG. 6 is a top view of a Doherty amplifier device 600 that includes a Doherty IC 602 (e.g., Doherty IC 200, FIG. 2) packaged in a high-power, discrete device package 604, in accordance with an example embodiment. Package 604 includes a plurality of conductive input signal and bias leads 610-616 and at least one output lead 620. The input signal and bias leads 610-616 are positioned at an input side of the package 604, and the at least one output lead 620 is positioned at an output side of the package 604. The input side (e.g., input side 210, FIG. 2) of the Doherty IC die 602 is proximate to and parallel with the input side of the device package 604, in an embodiment.

In addition, package 604 includes a package substrate, such as a conductive flange 630, to which Doherty IC 602 is physically and electrically connected (e.g., with conductive epoxy, solder, brazing, sintering, or other conductive connection methods). Finally, package 604 includes non-conductive structural features or materials, such as molding compound and/or other insulating materials, which hold the leads 610-616, 620 and the flange 630 in fixed orientations with respect to each other.

Electrically conductive connections, such as conductive wirebonds 650-656, electrically connect input signal and bias voltage bond pads (or terminals) on die 602 to conductive leads 610-616 on an input side of the device 600. For example, one or more first wirebonds 650 may electrically connect an input RF signal lead 610 to a first bondpad corresponding to an input terminal (e.g., input terminal 202, FIG. 2), and the input RF signal lead 610 may be used to convey an input RF signal to the Doherty IC 602.

According to an embodiment, the output of Doherty IC 602 (and more specifically the combining node structure 290, FIG. 2) is electrically connected to the output lead 620 through a plurality of wirebonds 670. According to an embodiment, package 604 is designed so that die 602, and more specifically the combining node structure of die 602, may be positioned very close to output lead 620 when die 602 is coupled to package 604. Accordingly, wirebonds 670 may be relatively short. In addition, the number of wirebonds 670 may be selected to be relatively large (e.g., 20-40 wirebonds, more or less), which renders wirebonds 670 a relatively low parasitic inductive element. According to an embodiment, wirebonds 670 have an inductance value in a range of about 20 pH to about 70 pH (e.g., about 60 pH) although the inductance value may be smaller or larger, as well. Desirably, wirebonds 670 are designed so that the inductance value of wirebonds 670 is as low as possible.

In some embodiments, leads 610-616, 620 and flange 630 may form portions of a lead frame. To complete an overmolded package during device manufacturing, after attachment of die 602 and wirebonds 650-656, 670, the die 602, the interior ends of leads 610-616, 620, wirebonds 650-656, 670, and the upper and side surfaces of flange 630 may be encapsulated with a non-conductive (e.g., plastic) molding compound 640, 642 (only partially shown in FIG. 6 to avoid obscuring the interior components of device 600). The molding compound 640, 642 defines the perimeter of the device 600 from which leads 610-616, 620 protrude, and also defines the top surface of the device 600. The bottom surface of the device 600 is defined partially by the molding compound 640, and partially by the bottom surface of flange 630. Accordingly, when appropriately coupled to a system substrate (e.g., PCB 710, FIG. 7), flange 630 may function to convey a ground reference to the die 602 (e.g., through the bottom conductive layer 328, FIG. 3), and also may function as a heat sink for the device 600.

In a similar but different embodiment, leads 610-616, 620 with the configurations shown in FIG. 6 may be replaced with lands of a no-leads package. The flange 630 and lands again may form a lead frame to which the die 602 and wirebonds 650-656, 670 are attached, and again the assembly may be encapsulated with a non-conductive molding compound to form a no-leads, surface mount device (e.g., a DFN or QFN device).

In other embodiments, package 604 may be an air-cavity package. In such an embodiment, flange 630 may have a larger perimeter, which is equal or approximately equal to the perimeter of the device 600. A non-conductive insulator (e.g., ceramic, plastic, or another material) with a frame shape may be attached to the top surface of the flange, leads 610-616, 620 may be placed over the non-conductive insulator, wirebonds 650-656, 670 are attached, and a cap (not illustrated) is placed over the frame opening to encase the interior components of the device 600 in an air cavity.

Ultimately, Doherty amplifier device 600 is incorporated into a larger electrical system (e.g., a power transmitter lineup in a cellular base station). For example, as illustrated in FIG. 7, a Doherty amplifier device 720 (e.g., device 600, FIG. 6) may be incorporated into amplifier system 700.

Amplifier system 700 includes a single-layer or multi-layer PCB 710, and a plurality of elements coupled to the PCB 710, in an embodiment. For example, the amplifier system 700 may include a conductive coin 715 (or other feature) that is exposed at top and bottom surfaces of the PCB 710, and a Doherty amplifier device 720 (e.g., device 600, FIG. 6) connected to the conductive coin 715. More specifically, the bottom surface (e.g., the bottom of flange 630, FIG. 6) of the Doherty amplifier device 720 may be physically and electrically connected to the top surface of the conductive coin 715. The conductive coin 715, in turn, may be electrically connected to system ground, and a bottom surface of the coin 715 may be connected to a system heat sink. Accordingly, the conductive coin 715 may function as a ground reference and a heat sink for the amplifier system 700.

In a typical configuration, the amplifier system 700 includes an input RF connector 701 and an output RF connector 702, which are configured, respectively, to receive an input RF signal from an RF signal source, and to produce an amplified output RF signal for transmission (e.g., via a cellular antenna coupled to connector 702). One or more bias voltage connectors 703, 704 may be used to receive DC bias voltages from one or more voltage sources.

In addition, the amplifier system 700 includes a plurality of conductive paths and features 730-736 that are electrically coupled between the connectors 701-703 and the Doherty amplifier device 720. The conductive paths and features 730-736 may be formed from patterned portions of a top conductive layer, a bottom conductive layer, and/or interior conductive layer(s) (if included) of the PCB 710.

A first conductive path 730 electrically connects the input RF connector 701 to an input RF signal lead 722 (e.g., lead 610, FIG. 6) of the Doherty amplifier device 720. An input RF signal received by input RF connector 701 is conveyed to the input RF signal lead 722 through the first conductive path 730 during operation of the system 700. Similarly, a second conductive path 731 electrically connects the output RF connector 702 to an output RF signal lead 728 (e.g., lead 620, FIG. 6) of the Doherty amplifier device 720. An amplified RF signal produced by the Doherty amplifier device 720 is conveyed to the output RF connector 702 through the second conductive path 731 during operation of the system 700.

Additional conductive paths 732, 733, 734 electrically connect the bias voltage connector 703 to a plurality of bias voltage leads 724 (e.g., leads 611, 613, 615, FIG. 6) on a first side of the Doherty amplifier device 720. A plurality of drain and gate DC bias voltages are conveyed to the bias voltage leads 724 through conductive paths 732-734 during operation of the system 700. On the output side, a conductive path 735 electrically connects the bias voltage connector 704 to the output RF signal lead 728 (e.g., either directly or through path 731, as shown in FIG. 7). A drain DC bias voltage for the final-stage amplifiers is conveyed to the output RF signal lead 728 through bias voltage connector 704, conductive path 735, and output RF signal lead 728 during operation of the system 700.

According to an embodiment, amplifier system 700 also includes a shunt inductor 750, which is electrically coupled between the output RF signal lead 728 and an additional conductive feature 736. The shunt inductor 750 may be a discrete inductor, for example, which has a first terminal coupled to the output RF signal lead 728 (e.g., either directly or through path 731, as shown in FIG. 7), and a second terminal coupled to the conductive feature 736, which in turn is electrically coupled to system ground. The shunt inductor 750 is configured to at least partially absorb the drain source capacitance of the peaking amplifier final-stage transistor(s) (e.g., drain-source capacitances, $C_{dsP}$, of the peaking amplifier final-stage FETs 250', 250", FIG. 2), in an embodiment. In an alternate embodiment, all or a portion of the shunt inductance provided by shunt inductor 750 instead may be provided by designing an optimized conductive path 735 between the bias voltage connector 704 and the output RF signal lead 728, in which case shunt inductor 750 may be omitted. Although conventional asymmetric Doherty amplifier systems may include a shunt inductance for this purpose, the shunt inductance typically needs to be implemented inside the amplifier package (e.g., inside device 720). However, the relatively low inductance of the output wirebonds (e.g., wirebonds 670, FIG. 6) enables the shunt inductance to be moved outside of the amplifier package, in accordance with various embodiments. This may enable the amplifier package size to be decreased, while also facilitating easier tuning of the system 700, since the shunt inductor 750 size can be modified without requiring a re-design of the Doherty amplifier device 720.

Figure 8A:
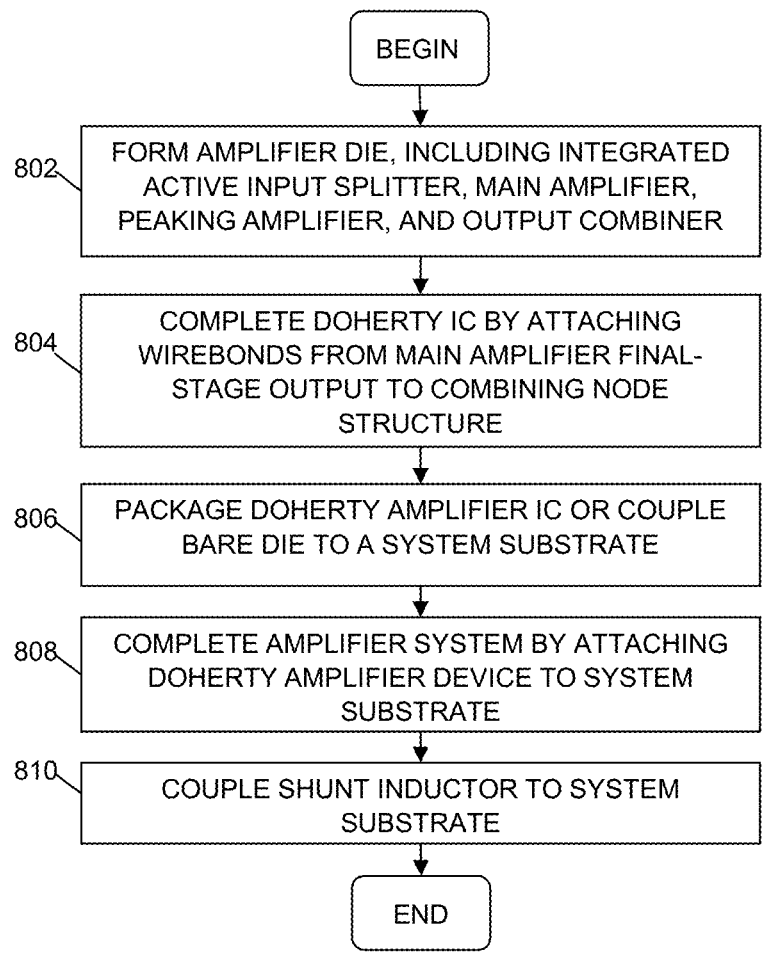
FIG. 8A is a flowchart of a method of making a Doherty power amplifier IC, and a packaged Doherty amplifier device, in accordance with an example embodiment.

FIG. 8A is a flowchart of a method of making a Doherty power amplifier IC (e.g., Doherty IC 200, FIG. 2), a packaged Doherty amplifier device (e.g., device 600, FIG. 6), and a Doherty amplifier system (e.g., system 700, FIG. 7), in accordance with an example embodiment. The method may begin, in block 802, by forming an amplifier die (e.g., die 201, FIG. 2), which includes integrally-formed main amplifier transistors (e.g., FETs 226, 230, FIG. 2), peaking amplifier transistors (e.g., FETs 246', 246", 250', 250", FIG. 2), and a combining node structure (e.g., combining node structure 290, FIG. 2). In addition, forming the amplifier die may include integrally-forming a power splitter (e.g., splitter 204, FIG. 2) having pre-driver amplifier transistors (e.g., amplifiers 423, 439', 439", 523, 539', 539", FIGS. 4, 5A), matching networks (e.g., IMN 222, 242', 242", ISMN 228, 248', 248", FIG. 2), bias circuits (e.g., bias circuits 270, 270', 270", FIG. 2), and/or other integrated components. In alternate embodiments, some of the circuits and components (e.g., the power splitter 204) in the previous sentence may be implemented on substrates that are distinct from the amplifier die.

In block 804, the Doherty amplifier IC (e.g., Doherty amplifier IC 200, FIG. 2) is completed by connecting the output terminal (e.g., drain terminal 231, FIG. 2) of the main amplifier final-stage transistor (e.g., FET 230, FIG. 2) to the combining node structure (e.g., combining node structure 290, FIG. 2). For example, the connection may be made with wirebonds (e.g., wirebonds 238, FIG. 2) that have a predetermined length, height, and number to create a desired phase delay (e.g., 90 degrees) between the main and peaking amplifier outputs.

The Doherty amplifier IC (e.g., Doherty IC 200, FIG. 2) may then be packaged in block 806. As mentioned previously, the Doherty amplifier IC may be packaged in an overmolded or air-cavity power package. Alternatively, the Doherty amplifier IC may be attached as a bare die to a system substrate (e.g., a module or PCB substrate). When packaged in an overmolded package (e.g., package 604, FIG. 6), the Doherty amplifier IC may be connected to a conductive flange of a leadframe, wirebonds (e.g., wirebonds 650-656, 670, FIG. 6) may be coupled between input, output, and bias leads of the leadframe and appropriate bond pads of the Doherty amplifier IC, and the flange, leads, and Doherty amplifier IC may be encapsulated in molding compound. When packaged in an air-cavity package, an insulator frame may be attached to the top surface of a conductive flange, the Doherty amplifier IC may be connected to the top surface of the flange in the frame opening, input, output, and bias leads may be connected to the top surface of the insulator frame, wirebonds (e.g., wirebonds 650-656, 670, FIG. 6) may be coupled between the input, output, and bias leads and appropriate bond pads of the Doherty amplifier IC, and a cap may be applied over the flange, insulator frame, leads, wirebonds, and Doherty amplifier IC to encase the Doherty amplifier IC in an air cavity.

In block 808, the amplifier system (e.g., system 700, FIG. 7) may be completed by attaching the Doherty amplifier device (e.g., device 600, FIG. 6) (or in some embodiments the bare die) to a system substrate, such as a PCB (e.g., PCB 710, FIG. 7). More specifically, the bottom surface of the Doherty amplifier device may be connected to a conductive coin (e.g., coin 715, FIG. 7) to provide a ground reference and heat sink to the device, and the device's input, output, and bias leads may be connected to corresponding conductive paths (e.g., paths 730-734, FIG. 7) of the system substrate.

According to an embodiment, additional components may be coupled to the system substrate (e.g., PCB 710, FIG. 7), in block 810, to complete the amplifier system. For example, as described previously, a discrete inductor (e.g., inductor 750, FIG. 7) may be coupled between the Doherty amplifier device's output lead (e.g., output lead 728, FIG. 7) and a ground reference by coupling the inductor to conductive features (e.g., path 731 and feature 736, FIG. 7) of the system substrate. Additionally, a metallic cover or shield connected to a ground plane of the PCB can be used to cover in whole or in part the components of the PCB 710 to provide electrical isolation from other devices of other systems. The method may then end.

Figure 8B:
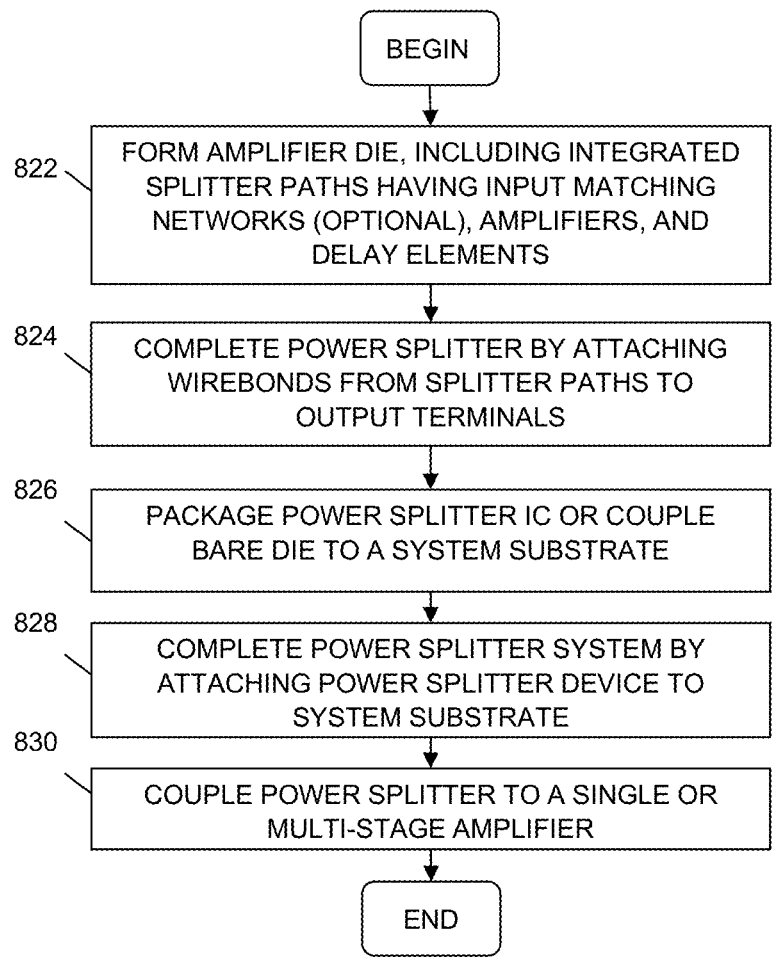
FIG. 8B is a flowchart of a method of making a power splitter IC, and a packaged power splitter device, in accordance with an example embodiment.

FIG. 8B is a flowchart of a method of making a power splitter IC (e.g., power splitter 104, FIG. 1, 204, FIG. 2, 404, FIG. 4, 504, FIG. 5A), a packaged power splitter device, and a power splitter system, in accordance with an example embodiment. The method may begin, in block 822, by forming a power splitter die, which includes integrally-formed input matching networks (e.g., 519, FIG. 5A, which can be optional), pre-driver amplifier transistors (e.g., FETs 423, 439', 439", 523, 539', 539", FIGS. 4, 5A), adjustment elements (e.g., transmission lines or CLCs 412, 414', 414", 512, 514', 514", FIGS. 4, 5A), and isolation resistors (e.g., 452-453, 552-553, FIGS. 4, 5A). In addition, forming the power splitter die may include integrally-forming bias circuits coupled to the pre-driver amplifier transistors 423, 439', 439", 523, 539', 539". In alternate embodiments, some of the circuits and components (e.g., input matching networks) may be implemented on substrates that are distinct from the power splitter die.

In block 824, the power splitter IC (e.g., power splitter IC 404, 504, FIGS. 4, 5A) is completed by connecting the output terminal of each adjustment element to wirebonds that have a predetermined length, height, and number to create a desired resulting branch phase (e.g., 90 degrees) that electrically isolates the splitter branches (e.g., 401-403, 501-503, FIGS. 4, 5A). The power splitter IC may then be packaged in block 826. Similar to the Doherty amplifier IC, the power splitter IC may be packaged in an overmolded or air-cavity power package. Alternatively, the power splitter IC may be attached as a bare die to a system substrate (e.g., a module or PCB substrate). When packaged in an overmolded package, the power splitter IC may be connected to a conductive flange of a leadframe, wirebonds may be coupled between input, output, and bias leads of the leadframe and appropriate bond pads of the power splitter IC, and the flange, leads, and power splitter IC may be encapsulated in molding compound. When packaged in an air-cavity package, an insulator frame may be attached to the top surface of a conductive flange, the power splitter IC may be connected to the top surface of the flange in the frame opening, input, output, and bias leads may be connected to the top surface of the insulator frame, wirebonds may be coupled between the input, output, and bias leads and appropriate bond pads of the power splitter IC, and a cap may be applied over the flange, insulator frame, leads, wirebonds, and power splitter IC to encase the power splitter IC in an air cavity.

In block 828, the power splitter system may be completed by attaching the power splitter device (or in some embodiments the bare die) to a system substrate, such as a PCB. More specifically, the bottom surface of the power splitter device may be connected to a conductive coin to provide a ground reference and heat sink to the device, and the device's input, output, and bias leads may be connected to corresponding conductive paths of the system substrate.

According to an embodiment, additional components may be coupled to the power splitter system substrate, in block 830. For example, outputs of the power splitter system substrate may be coupled to a single-stage or multi-stage amplifier such as a Doherty amplifier device that does not have an integrally formed power splitter. The method may then end.

An embodiment of a power splitter may include power amplifiers and corresponding adjustment elements. The power splitter can be a on a single die or combined with the multi-path amplifier (e.g., Doherty amplifier) on the same die. The power splitter can include a plurality of power splitter branches, each branch configurable to couple to an input terminal of a multi-path amplifier. Each power splitter branch includes a pre-driver amplifier and adjustment element. To achieve a desired phase delay and impedance matching characteristics for coupling to pre-driver amplifier outputs, the adjustment element can comprise a transmission line with a suitable electrical length, a lumped-element delay circuit, a combination of both, or other suitable delay circuit. Additionally, the adjustment elements can be configured to also provide impedance matching characteristics for coupling to input paths of a multi-path amplifier device. The pre-driver amplifier of each splitter branch can be a single-stage amplifier or multi-stage amplifier that is configurable to couple to a single-stage amplifier or multi-stage amplifier path of a multi-path amplifier device such as a Doherty amplifier device.

The pre-driver amplifier in each power splitter branch can have symmetric or asymmetric gain relative to the pre-driver amplifier of other splitter branches. Additionally, each pre-driver amplifier in each power splitter branch can be configured for a specific frequency band or a range of frequency bands may be the same or differ from the frequency band or a range of frequency bands of the pre-driver amplifier of other splitter branches. Further, each pre-driver amplifier can be configured with input filter circuits and/or matching network circuits for coupling to an RF input source. In order to increase electrical isolation between power splitter branches, each branch can be configured to have similar or substantially equal phase delay (e.g., 90 degrees or other suitable delay). An isolation impedance can also be added between power splitter branches to further increase electrical isolation between such branches.

An embodiment of a multiple-branch splitter can include a semiconductor die, a radio frequency (RF) signal input terminal, a first splitter branch, and a second splitter branch. An embodiment of the first splitter branch can include a first amplifier and a first adjustment element integrally formed with the semiconductor die. A first gate terminal of the first amplifier can be coupled to the RF signal input terminal, and a first drain terminal of the first amplifier can be coupled to a first input of the first adjustment element. The second splitter branch can include a second amplifier and a second adjustment element integrally formed with the semiconductor die. A second gate terminal of the second amplifier can be coupled to the RF signal input terminal, and a second drain terminal of the second amplifier can be coupled to a second input of the second adjustment element. The first splitter branch has a first combined phase delay based at least on a combination of a first phase delay of the first amplifier and a second phase delay of the first adjustment element. The second splitter branch has a second combined phase delay based at least on a combination of a third phase delay of the second amplifier and a fourth phase delay of the second adjustment element. The first splitter branch is substantially electrically isolated from the second splitter branch based on the first combined phase delay being substantially equal to the second combined phase delay. In an embodiment, the first combined phase delay can be substantially equal to the second combined phase delay when a phase offset between the first and second combined phase delays is +/−10% or lower. Other phase offset ranges that may be less than or more than +/−10% are contemplated by the subject disclosure. In an embodiment, the first splitter branch and the second splitter branch can be configured to split and amplify an input power level of an RF signal upon being applied at the RF signal input terminal according to an amplification ratio which may or may not be symmetric.

An embodiment of a multiple-path amplifier can include a semiconductor substrate, first and second splitter branches, and first and second amplification paths. The first splitter branch can include a first pre-driver amplifier integrally formed on the semiconductor substrate. A first gate terminal of the first pre-driver amplifier can be coupled to an RF signal input terminal. The second splitter branch can include a second pre-driver amplifier integrally formed on the semiconductor substrate. A second gate terminal of the second pre-driver amplifier can be coupled to the RF signal input terminal. The first amplification path can be integrally formed on the semiconductor substrate and can be further coupled to a first output of the first splitter branch. The second amplification path can be integrally formed on the semiconductor substrate and can coupled to a second output of the second splitter branch. In an embodiment, the first splitter branch can provide a first pre-amplification level of an RF signal upon being applied at the RF signal input terminal to generate a first amplified signal supplied to the first amplification path. The second splitter branch can provide a second pre-amplification level of the RF signal to generate a second amplified signal supplied to the second amplification path. Electrical coupling between the first splitter branch and the second splitter branch can be substantially reduced by configuring the first splitter branch and the second splitter branch to have approximating phase delays. In an embodiment, approximating phase delays can be achieved when a phase offset between the first and second splitter branches is +/−10% or lower. Other phase offset ranges that may be less than or more than +/−10% are contemplated by the subject disclosure.

In an embodiment, the power splitter can be manufactured according to a method. The method can include forming first and second splitter branches on a semiconductor substrate. The first splitter branch can include a first amplifier and a first adjustment element integrally formed with the semiconductor substrate. A first gate terminal of the first amplifier can be coupled to an RF signal input terminal, and a first drain terminal of the first amplifier can be coupled to a first input of the first adjustment element. The second splitter branch can include a second amplifier and a second adjustment element integrally formed with the semiconductor substrate. A second gate terminal of the second amplifier can be coupled to the RF signal input terminal, and a second drain terminal of the second amplifier can be coupled to a second input of the second adjustment element. The first splitter branch is substantially electrically isolated from the second splitter branch based on the first splitter branch and the second splitter branch having substantially similar phase delays. In an embodiment, substantially similar phase delays can be achieved when a phase offset between the first and second splitter branches is +/−10% or lower. Other phase offset ranges that may be less than or more than +/−10% are contemplated by the subject disclosure.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-branch splitter, comprising:
   a semiconductor die;
   a radio frequency (RF) signal input terminal;
   first and second splitter output terminals;
   a first splitter branch including a first amplifier and a first adjustment element coupled in series and integrally formed with the semiconductor die, wherein the first amplifier comprises a first field effect transistor (FET) formed from one or more elongated first transistor fingers, a first gate terminal of the first amplifier is coupled to the RF signal input terminal, and wherein a first drain terminal of the first amplifier is coupled to the first splitter output terminal;
   a second splitter branch including a second amplifier and a second adjustment element coupled in series and integrally formed with the semiconductor die, wherein the second amplifier comprises a second FET formed from one or more elongated second transistor fingers that are parallel with the first transistor fingers, a second gate terminal of the second amplifier is coupled to the RF signal input terminal, and wherein a second drain terminal of the second amplifier is coupled to the second splitter output terminal;
   wherein the first splitter branch has a first combined phase delay based at least on a combination of a first phase delay of the first amplifier and a second phase delay of the first adjustment element,
   wherein the second splitter branch has a second combined phase delay based at least on a combination of a third phase delay of the second amplifier and a fourth phase delay of the second adjustment element, and
   wherein the first splitter branch and the second splitter branch are configured to split and amplify an input power level of an RF signal upon being applied at the RF signal input terminal according to an amplification ratio.

2. The multiple-branch splitter of claim 1, further comprising an isolation impedance, wherein a first terminal of the isolation impedance is coupled to a first output terminal of the first adjustment element, wherein a second terminal of the isolation impedance is coupled to a second output terminal of the second adjustment element, and wherein the isolation impedance increases isolation between the first splitter branch and the second splitter branch.

3. The multiple-branch splitter of claim 1, wherein the first adjustment element comprises a transmission line having an electrical length that produces the second phase delay.

4. The multiple-branch splitter of claim 3, wherein the second adjustment element comprises a transmission line having an electrical length that produces the fourth phase delay.

5. The multiple-branch splitter of claim 1, wherein the first adjustment element comprises a lumped-element delay circuit that produces the second phase delay.

6. The multiple-branch splitter of claim 5, wherein the second adjustment element comprises a lumped-element delay circuit that produces the fourth phase delay.

7. The multiple-branch splitter of claim 1, wherein the first combined phase delay is substantially equal to 90 degrees.

8. The multiple-branch splitter of claim 7, wherein the second combined phase delay is substantially equal to 90 degrees.

9. The multiple-branch splitter of claim 1, wherein a first output terminal of the first splitter branch is coupled to at least one peaking amplification path of a Doherty amplifier, wherein a second output terminal of the second splitter branch is coupled to a main amplification path of the Doherty amplifier, and wherein the semiconductor die is a single semiconductor die, and wherein the Doherty amplifier is integrally formed with the single semiconductor die.

10. The multiple-branch splitter of claim 1, wherein the first adjustment element is further configured to substantially match a first impedance of the first drain terminal of the first amplifier, and the second adjustment element is further configured to substantially match a second impedance of the second drain terminal of the second amplifier.

11. The multiple-branch splitter of claim 1, wherein the amplification ratio between the first splitter branch and the second splitter branch is asymmetric.

12. The multiple-branch splitter of claim 1, wherein the amplification ratio between the first splitter branch and the second splitter branch is substantially symmetric.

13. A multiple-branch splitter, comprising:
a semiconductor die;
a radio frequency (RF) signal input terminal;
first, second, and third splitter output terminals;
a first splitter branch including a first amplifier and a first adjustment element coupled in series and integrally formed with the semiconductor die, wherein a first gate terminal of the first amplifier is coupled to the RF signal input terminal, and wherein a first drain terminal of the first amplifier is coupled to the first splitter output terminal;
a second splitter branch including a second amplifier and a second adjustment element coupled in series and integrally formed with the semiconductor die, wherein a second gate terminal of the second amplifier is coupled to the RF signal input terminal, and wherein a second drain terminal of the second amplifier is coupled to the second splitter output terminal; and
a third splitter branch including a third amplifier and a third adjustment element coupled in series and integrally formed with the semiconductor die, wherein a third gate terminal of the third amplifier is coupled to the RF signal input terminal, and wherein a third drain terminal of the third amplifier is coupled to the third splitter output terminal,
wherein the first splitter branch has a first combined phase delay based at least on a combination of a first phase delay of the first amplifier and a second phase delay of the first adjustment element,
wherein the second splitter branch has a second combined phase delay based at least on a combination of a third phase delay of the second amplifier and a fourth phase delay of the second adjustment element,
wherein the third splitter branch has a third combined phase delay based on at least a combination of a fifth phase delay of the third amplifier and a sixth phase delay of the third adjustment element, and
wherein the first splitter branch, the second splitter branch, and the third splitter branch are configured to split and amplify an input power level of an RF signal upon being applied at the RF signal input terminal according to an amplification ratio.

14. A method, comprising:
forming a first splitter branch on a semiconductor substrate, the first splitter branch including a first amplifier and a first adjustment element coupled in series and integrally formed with the semiconductor substrate, wherein the first amplifier comprises a first field effect transistor (FET) formed from one or more elongated first transistor fingers, a first gate terminal of the first amplifier is coupled to an RF signal input terminal, wherein a first drain terminal of the first amplifier is coupled to a first splitter output terminal, and wherein the first splitter branch has a first combined phase delay based at least on a combination of a first phase delay of the first amplifier and a second phase delay of the first adjustment element; and
forming a second splitter branch on the semiconductor substrate, the second splitter branch including a second amplifier and a second adjustment element coupled in series and integrally formed with the semiconductor substrate, wherein the second amplifier comprises a second FET formed from one or more elongated second transistor fingers that are parallel with the first transistor fingers, a second gate terminal of the second amplifier is coupled to the RF signal input terminal, wherein a second drain terminal of the second amplifier is coupled to a second splitter output terminal, and wherein the second splitter branch has a second combined phase delay based at least on a combination of a third phase delay of the second amplifier and a fourth phase delay of the second adjustment element, and
wherein the first splitter branch and the second splitter branch are configured to split and amplify an input power level of an RF signal upon being applied at the RF signal input terminal according to an amplification ratio.

15. The method of claim 14, further comprising:
forming a first amplification path on the semiconductor substrate, the first amplification path being coupled to a first output of the first adjustment element; and
forming a second amplification path on the semiconductor substrate, the second amplification path being coupled to a second output of the second adjustment element.

16. The method of claim 15, wherein the first amplification path comprises a main amplification path of a Doherty amplifier, and wherein the second amplification path comprises at least one peaking amplification path of the Doherty amplifier.

17. The method of claim 14, wherein each of the first amplifier and the second amplifier comprise a silicon-based field effect transistor (FET), a silicon-germanium (SiGe) based FET, a gallium nitride (GaN) based FET, a gallium arsenide (GaAs) based FET, a gallium phosphide (GaP) based FET, an indium phosphide (InP) based FET, an indium antimonide (InSb) based FET, or any combinations thereof.

18. The multiple-branch splitter of claim 1, wherein a first number of the first transistor fingers equals a second number of the second transistor fingers.

19. The multiple-branch splitter of claim 1, wherein a first number of the first transistor fingers is greater than a second number of the second transistor fingers.

20. The multiple-branch splitter of claim 1, wherein:
the first FET is formed from multiple ones of the first transistor fingers,
gate terminals of the multiple ones of the first transistor fingers are electrically connected together, and
drain terminals of the multiple ones of the first transistor fingers are electrically connected together.

21. The multiple-branch splitter of claim 1, wherein:
the one or more first transistor fingers has a first periphery; and
the one or more second transistor fingers has a second periphery that is different from the first periphery.

22. The multiple-branch splitter of claim 1, wherein:
the first adjustment element comprises a first inductance coupled between the first drain terminal and the first splitter output terminal, and a first shunt capacitor coupled between the first drain terminal and a ground reference; and
the second adjustment element comprises a second inductance coupled between the second drain terminal and the second splitter output terminal, and a second shunt capacitor coupled between the second drain terminal and the ground reference.

23. The multiple-branch splitter of claim 1, wherein:
the first adjustment element comprises a first CLC circuit section with a first shunt capacitor coupled between the first drain terminal and a ground reference, a first inductance coupled between the first drain terminal and the first splitter output terminal, and a second shunt capacitor coupled between the first splitter output terminal and the ground reference; and the second adjustment element comprises a second CLC circuit section with a third shunt capacitor coupled between the second drain terminal and the ground reference, a second inductance coupled between the second drain terminal and the second splitter output terminal, and a fourth shunt capacitor coupled between the second splitter output terminal and the ground reference.

24. The multiple-branch splitter of claim 1, further comprising:

a first filter circuit coupled between the RF signal input terminal and the first gate terminal, wherein the first filter circuit includes a first inductance coupled between the RF signal input terminal and the first gate terminal, and a first shunt capacitor coupled between the first gate terminal and a ground reference; and a second filter circuit coupled between the RF signal input terminal and the second gate terminal, wherein the second filter circuit includes a second inductance coupled between the RF signal input terminal and the second gate terminal, and a second shunt capacitor coupled between the second gate terminal and the ground reference.

25. The multiple-branch splitter of claim 24, further comprising:

a third shunt capacitor coupled between the RF signal input terminal and the ground reference.

* * * * *